United States Patent [19]
Kenney

[11] Patent Number: 6,020,250
[45] Date of Patent: Feb. 1, 2000

[54] STACKED DEVICES

[75] Inventor: Donald McAlpine Kenney, Shelburne, Vt.

[73] Assignee: International Business Machines Corporation, Armonk, N.Y.

[21] Appl. No.: 09/053,227

[22] Filed: Apr. 1, 1998

Related U.S. Application Data

[62] Division of application No. 08/473,538, Jun. 7, 1995, Pat. No. 5,801,089, which is a division of application No. 08/289,069, Aug. 11, 1994, Pat. No. 5,583,368.

[51] Int. Cl.[7] .................................................. H01L 21/76
[52] U.S. Cl. .......................... 438/422; 438/589; 438/409; 438/408
[58] Field of Search ..................................... 438/404, 405, 438/408, 409, 411, 421, 422, 589

[56] References Cited

U.S. PATENT DOCUMENTS 3,919,060  11/1975  Pogge et al. ............................ 438/409
4,104,090  8/1978  Pogge ..................................... 438/409
5,057,450  10/1991  Bronner et al. ......................... 438/422
5,306,659  4/1994  Beyer et al. ............................ 438/422

Primary Examiner—Trung Dang
Attorney, Agent, or Firm—James M. Leas

[57] ABSTRACT

Chips having subsurface structures within or adjacent a horizontal trench in bulk single crystal semiconductor are presented. Structures include three terminal devices, such as FETs and bipolar transistors, rectifying contacts, such as pn diodes and Schottky diodes, capacitors, and contacts to and connectors between devices. FETs have low resistance connectors to diffusions while retaining low overlap capacitance. A low resistance and low capacitance contact to subsurface electrodes is achieved by using highly conductive subsurface connectors which may be isolated by low dielectric insulator. Stacks of devices are formed simultaneously within bulk single crystal semiconductor. A subsurface CMOS invertor is described. A process for forming a horizontal trench exclusively in heavily doped p+ regions is presented in which porous silicon is first formed in the p+ regions and then the porous silicon is etched.

3 Claims, 20 Drawing Sheets

STACKED DEVICES

This application is a division of application Ser. No. 08/473,538 filed Jun. 7, 1995, now U.S. Pat. No. 5,801,089, which is a division of application Ser. No. 08/289,069 filed Aug. 11, 1994, now U.S. Pat. No. 5,583,368.

FIELD OF THE INVENTION

This invention generally relates to semiconductor devices formed within bulk single crystal semiconductor substrate and, more particularly, to semiconductor devices with electrodes formed in horizontal trenches buried within bulk single crystal semiconductor substrate, and to stacked semiconductor devices formed simultaneously within the single crystal semiconductor.

BACKGROUND OF THE INVENTION

To increase the number of devices on semiconductor chips, efforts have been made over a long period of time to build semiconducting devices other than at the surface of the chip. For example, capacitors for 4 megabit and higher memory chips are currently in production either in stacks above the silicon surface or in trenches below. Vertical multi-junction solar cells have pn junctions in grooves etched deeply into the silicon. Field effect transistors (FETs) have also been stacked as described hereinbelow.

With respect to trench capacitors, significant progress has been made to increase the surface area of the trench. Deep vertical trenches and derivatives from vertical trenches, such as crystallographic orientation dependent etches and horizontal trench etches, all add capacitor surface area without using up additional chip surface area. For example, commonly assigned U.S. Pat. No. 4,397,075 to Fatula, Jr. et al., describes a capacitor with increased surface area achieved by crystallographic etch within a trench. A paper by D. L. Kendall in "Applied Physics Letters," Vol. 26, No.4, 2-15-75, p. 195 (the "Kendall paper"), describes orientation dependent etches for forming narrow vertical grooves in silicon suitable for capacitors and vertical multi-junction solar cells. U.S. Pat. No. 5,068,199 to Sandhu (the "'199 patent") describes a capacitor with increased surface area achieved by the use of porous silicon. Commonly assigned U.S. Pat. No. 5,160,987 to Pricer (the "'987 patent"), and U.S. Pat.No. 4,763,179 to Tsubouchi et al. (the "'179 patent"), describe capacitors with increased surface area achieved by forming horizontal trenches from a standard vertical trench In the '987 patent, the buried horizontal trenches of the capacitor are formed by dopant concentration preferential etching of a plurality of lightly doped layers located between heavily doped layers of polysilicon or single crystal silicon. The single crystal layers are formed by a series of chemical vapor depositions performed in ultra high vacuum (UHV-CVD) at low temperature. In the '179 patent, a single buried horizontal trench is formed by an isotropic silicon etch at the exposed bottom of a trench provided with coated walls. However, with isotropic etching vertical etching is extensive and the horizontal trench so formed is much wider than trenches form with an orientation dependent etchant. In fact, the isotropically etched trench is round in shape.

While the process of forming a buried horizontal trench by means of the etching of alternately doped regions provides means for increasing capacitance a described in the references mentioned hereinabove, processes previously disclosed have not been suitable for stacking FETs. The problem with applying some of these processes in the fabrication of FETs is that the lightly doped regions are etched more rapidly than the heavily doped regions. Practical FETs and other active devices cannot be formed in the heavily doped regions remaining after the etch.

However, a paper by H. Horie et al "A New SOI Fabrication Technique for ultrathin Active Layer of Less than 80 nm," published by the IEEE in the 1990 *Symposium on VLSI Technology* describes an etchant that preferentially attacks n+ silicon, such as a solution of HF, HNO3, and CH3COOH at a 1/3/8 ratio and can be used to hollow-out an n+ layer, forming a horizontal trench.

Horizontal trenches have also been used for improved isolation as exemplified by U.S. Pat. No. 5,112,771 to Ishii et al. (the "'771 patent") and in the disclosure "Total Dielectric Isolation," by B. M. Kemlage, et. al., *IBM Technical Disclosure Bulletin*, Vol. 24, no. 110, April 1982 (the "Kemlage paper"). In the '771 patent, a process is disclosed for forming a horizontal trench by a method similar to that described hereinabove for the '179 patent. The Kemlage paper describes a process for forming a horizontal trench at the exposed bottom of a vertical trench with coated walls formed in a substrate with a <111> orientation by a highly selective crystallographic orientation dependent etch.

U.S. Pat. No. 4,685,198 to Kawakita et al. provides full oxide isolation by thermally oxidizing under a device region from adjacent vertical trenches with protected sidewalls that have been sideways crystalographically etched. However, the etch does not appear to form horizontal trenches.

In another embodiment in the '987 patent, horizontal trenches are used for the formation of a stack of memory cells, each comprising a polysilicon capacitor and a polysilicon diode transfer device. The horizontal trenches are formed by preferentially etching layers of polysilicon separated by layers of insulator. However, there are two problems with the stack of memory cells described in the '987 patent. First, a diode transfer device formed in polysilicon is much inferior to a transistor in single crystal silicon. Second, the surface area and capacitance of each horizontal trench are smaller than that of a vertical trench if the structures are to be tightly packed on a chip.

With respect to transistor stacking, significant effort has gone into providing a second surface of silicon for device fabrication. This second surface provides the surface on which the second in a stack of two transistors is formed.

In one line of work, stacked CMOS invertor structures are built in which p-channel and n-channel devices share a gate, with one built in single crystal below the gate, the other built in polysilicon on top of the gate. For example, in U.S. Pat. No. 4,272,880 to Pashley, an invertor circuit is fabricated using multilayer integrated circuit processing. Another multilayer arrangement is illustrated in U.S. Pat. No. 4,240,097 to Raymond. However, carrier mobility in polysilicon is significantly lower than mobility in single crystal silicon, and so switching time for the upper device is longer. As will be seen below, because the two devices are formed in sequence, the lower device, although formed in single crystal, also suffers performance degradation.

In a related approach, the second surface of silicon is formed as single crystal silicon, either by epitaxial overgrowth or by recrystallizing the deposited polysilicon with a laser, electron beam, or strip heater. For example, commonly assigned U.S. Pat. No. 4,603,341 to Bertin, et. al. describes a method of forming a stack of transistors for a read only memory in which polysilicon on the second layer is recrystallized to form single crystal silicon by laser annealing. These methods overcome the limitations of polysilicon, but overgrowth and recrystallization efforts have still only had limited success.

In all the stacking methods so far discussed, it is believed that transistors at each level are formed sequentially. The lowest level of transistors are formed first, then the next layer of silicon is deposited and transistors are formed on that level. The steps are repeated for each succeeding level. Because some of the steps, such as gate oxidation, require elevated temperatures that drive dopants deeper, lower level transistors are exposed to a significantly higher thermal budget than higher level transistors. Dopants at the lower levels are therefore driven significantly deeper, seriously degrading lower level transistor performance. This problem cannot be cured by improvements in the quality of deposited or recrystallized polysilicon unless improvements reducing thermal budget are found.

Recently issued, and commonly assigned U.S. Pat. No. 5,319,240, (the "'240 patent") to Faure et al., discloses a stack of FETs formed simultaneously in horizontal trenches in alternately doped layers of UHV-CVD single crystal silicon. Channel regions are formed of unetched p− bulk single crystal silicon and the gates are formed of polysilicon deposited within the horizontal trenches. Source and drain regions and connectors thereto are diffussed from doped oxide adjacent to the channel. This poses a problem since the connectors must be as narrow as the source and drain diffusions. Thus, device series resistance is traded off against device overlap capacitance, and performance is significantly degraded compared to standard surface devices (in which source and drain connectors are formed separately from diffusions and can therefore use higher conductance layers). The '240 patent discloses horizontal trenches formed by dopant concentration is preferential etching in which the etchant stops on p+ silicon, and in which, under proper bias conditions the etchant continues to etch n doped silicon and stops on p− silicon. These p+ layers may be completely oxidized. Thus, substantially continuous p+ layers or oxidized residues of p+ layers are left adjacent or sandwiching each device and horizontal trench. These p+ layers or oxidized residues of p+ layers add to the vertical dimension of each device and interfere with forming devices sharing a gate.

Thus, the prior art describes techniques for forming trenches to increase capacitance and improve electrical isolation; for building stacks of polysilicon memory cells with diode transfer-devices; for forming a second layer of silicon for stacking transistors either in polysilicon or in single crystal silicon formed by overgrowth or recrystallization; and for simultaneously forming stacks of FETs that have substantially continuous p+ layers adjacent or sandwiching each device and that have high resistance diffused connectors to source and drain.

It is believed that the prior art has failed to provide a method of forming horizontal trenches suitable for FETs and other 3-terminal devices by means of preferentially etching heavily doped p regions instead of heavily doped n regions or lightly doped regions. Nor is it believed that the prior art provided means to wire between the electrodes of simultaneously formed subsurface transistors to form a stack of invertors. Nor is it believed that the prior art provided means to wire between a specific subsurface electrode and another in a stack of devices formed in other than sequentially deposited layers of silicon. Furthermore, the prior art apparently has not provided means for overcoming the performance degradation of the lower level transistors in a sequentially deposited stack of transistors or the connector related performance degradation in all of the transistors of a simultaneously formed stack of transistors.

SUMMARY OF THE INVENTION

It is therefore an object of the present invention to provide a subsurface FET or a stack of subsurface FETs in bulk single crystal silicon in which all FETs are formed simultaneously and all experience the same thermal budget, and all have low resistance connectors to source or drain while retaining low overlap capacitance.

It is another object of this invention to provide an improved subsurface contact to an electrode of a device having a portion in bulk single crystal substrate.

It is another object of this invention to provide an improved method of forming a horizontal trench buried within a semiconductor substrate by means of an orientation dependent crystallographic etch.

It is another object of this invention to provide a method of forming a horizontal trench in a heavily doped region by first forming porous silicon.

It is another object of this invention to provide a method of etching a horizontal trench so as to leave either bulk single crystal n regions or bulk single crystal p regions.

It is another object of this invention to provide a low resistance and low capacitance subsurface horizontal connector.

It is another object of this invention to provide a subsurface vertical conductor between specified regions of subsurface transistors.

It is another object of this invention to provide silicon-on-insulator structures.

It is another object of this invention to provide an improved CMOS invertor.

These and other objects of the invention are accomplished in a semiconductor chip which comprises a bulk single crystal substrate having a buried horizontal trench. This trench is not adjacent either a substantially continuous p+ layer or an oxidized residue of a substantially continuous p+ layer. An electronic device has a portion adjacent the horizontal trench within the bulk single crystal substrate.

An alternate embodiment again has a semiconductor chip which comprises a bulk single crystal substrate having a buried horizontal trench. An electronic device has a portion adjacent the horizontal trench within the bulk single crystal substrate. A vertical trench intersects this portion and an electrically conductive material extends through this vertical trench and forms a contact with this portion.

An alternate embodiment again has a semiconductor chip which comprises a bulk single crystal substrate semiconductor, the semiconductor having a conventional planar surface. A first three-terminal device is disposed in a first plane parallel to this surface. This first device comprises first and second electrodes within the bulk single crystal semiconductor. It also comprises a third control electrode that controls electrical connection between the first and second electrodes when the device is operational. A second three-terminal device is disposed in a second plane parallel to the surface. This second device comprises forth and fifth electrodes within the bulk single crystal semiconductor. It also comprises a sixth control electrode that controls electrical connection between the forth and fifth electrodes when the device is operational. A terminal of the second device is vertically displaced with respect to a respective terminal of the first device. A vertical trench is adjacent the first electrode. A first conductive connector contacts the first electrode, and the first conductive connector extends through the vertical trench.

The invention also includes a method of forming a horizontal trench in a substrate, the method comprising the steps of providing a bulk single crystal substrate having a p+ diffused layer, etching a vertical trench in the substrate intersecting the p+ layer, forming porous silicon in the p+ layer, and etching away the porous silicon.

In specific preferred embodiments of the invention, a buried horizontal trench is formed in a single crystal semiconductor substrate. A layer of electrically conductive material is deposited within the horizontal trench to form part of an electronic device, or to form a low resistance or low capacitance connector extending through a vertical trench. A gate of an FET is formed if the conductive material is deposited on an insulator formed on the surface of the horizontal trench. A contact to source or drain is formed if the conductive material is deposited in contact with the source or drain diffusion. A diffusion is made available for contact by means of an adjacent vertical or horizontal trench. Source and drain diffusions are formed for FETs by diffusion from doped glass or doped polysilicon or by ion implantation. The conductive material used for contact can be the dopant source for the diffusion. A stack of two FETs may be simultaneously formed either sharing a gate or with separate gates located in a single horizontal trench. Alternatively, a stack of FETs may be simultaneously formed comprising a stack of gates located in a stack of horizontal trenches. Structure and process for forming a vertical conductor between FETs sharing a gate, described more fully hereinbelow, form a CMOS invertor.

DETAILED DESCRIPTION OF THE INVENTION

Figure 1A:
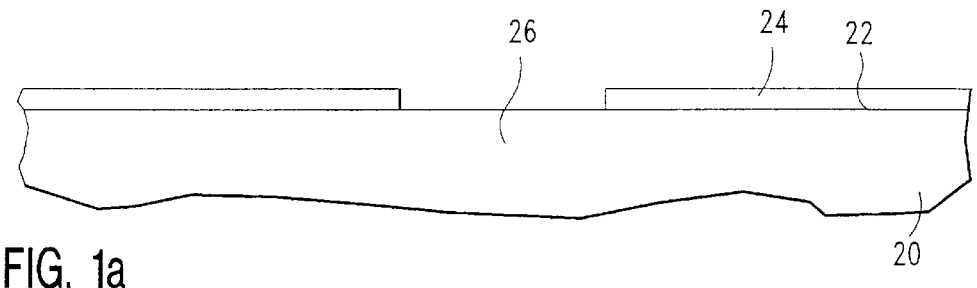
FIGS. 1a–1g are cross-sectional views showing a first set of process steps for making a horizontal trench or stack of trenches by means of a crystallographic orientation dependent etch.

The present invention is a semiconductor electronic device, a stack of electronic devices, or a contact to a subsurface portion of an electronic device. A contact to an electronic device of the present invention is formed from a layer of conductive material contacting a portion of an electronic device adjacent a horizontal trench buried within bulk single crystal substrate. The term "horizontal" as used in this application is defined as a plane parallel to the conventional planar surface of a semiconductor chip or wafer, regardless of the orientation the chip is actually held.

The term "vertical" refers to a direction perpendicular to the horizontal as defined above. Prepositions, such as "under" and "over" are defined with respect to the conventional planar surface being on the top surface of the chip or wafer, regardless of the orientation the chip is actually held. The term "stack" refers to two or more devices with a portion of a first device at a different vertical level than a respective portion of a second device. Respective portions of devices at different vertical levels are referred to as "vertically displaced." Such devices can also have horizontal displacement. Stacked devices can share one or more of their parts and still be separate devices.

Electronic devices that may be formed in accordance with the present invention include, but are not limited to, bipolar transistors; FETs; diodes, including pn diodes and Schottky diodes; resistors, and capacitors. Included also are conductive connectors that provide external contact to electrodes of these devices. These connectors can also provide back bias contacts. The present invention also provides a method of making such electronic devices and electrodes, including methods for making the horizontal trenches in which or adjacent which portions of the electronic devices, electrodes, conductive connectors, and contacts are formed.

The electronic devices of the present invention are formed in single crystal semiconducting wafers in accordance with the process steps illustrated in FIGS. 1–10. Such wafers may be formed from materials such as silicon, germanium, and gallium arsenide, or alloys containing those materials or other materials. Because silicon is most widely used and the most is known about its etch properties, the following description of the present invention is based on the use of a silicon wafer as the substrate in which the electronic devices are formed. The wafer may have had implants, diffusions, oxidations, and other process steps completed before embarking on the process sequences described hereinbelow.

The term "bulk single crystal semiconductor" as used in this application is defined as conventional single crystal semiconductor or the single crystal semiconductor with additional single crystal layers grown thereon by methods such as conventional epitaxial growth, UHV-CVD, and molecular beam epitaxial growth. Excluded are single crystal layers formed on insulator seeded from bulk single crystal silicon by methods such as epitaxial overgrowth and recrystalizing a deposited polycrystalline film. The term, "within the bulk single crystal semiconductor" is defined as under the surface of the bulk single crystal silicon. The term "a surface of bulk single crystal substrate" is either a conventional external surface or an internal surface of the bulk single crystal substrate formed by methods such as the trench methods described here.

The process sequence for forming the devices of the present invention consists of two primary components: (1) formation of the horizontal trench, and (2) formation of the devices and their conductive connectors within and adjacent the trench.

Process steps for forming the horizontal trench by crystallographic orientation dependent etch, the first of the several trench formation techniques to be described hereinafter, are illustrated in FIGS. 1a–1g. Silicon wafer 20, having surface 22 with a <111> orientation is preferred since the slow etch rate exhibited by alkaline etchants for the <111> crystallographic orientation, compared to silicon substrates with a <110> surface orientation, provides a simple and convenient means to form a narrow horizontal trench, as described below. The process can be followed with other wafer surface orientations if etchants become available that have similar crystallographic etch rate differences.

As a first step, masking layer 24 is formed on surface 22 of wafer 20 by methods known in the art, such as oxidation of the silicon surface or chemical vapor deposition of a material such as silicon oxide or silicon nitride. Openings 26 are then formed in masking layer 24 as illustrated in FIG. 1a using standard techniques, including photolithography and etch steps known in the art. Rectangular openings 26 with a long aspect ratio are preferred in masking layer 24, with the long edges preferably aligned in the direction of vertical <110> planes in the silicon wafer because the fastest and most uniform etching will be along the <110> plane. When using the <111> orientation-dependent etchants described below, ends of the trench perpendicular to the <110> direction etch less uniformly, so it is desirable to provide trenches with a long aspect ratio to minimize the space devoted to these end regions and to provide the largest proportion of a uniformly etched horizontal trench.

Figure 1B:
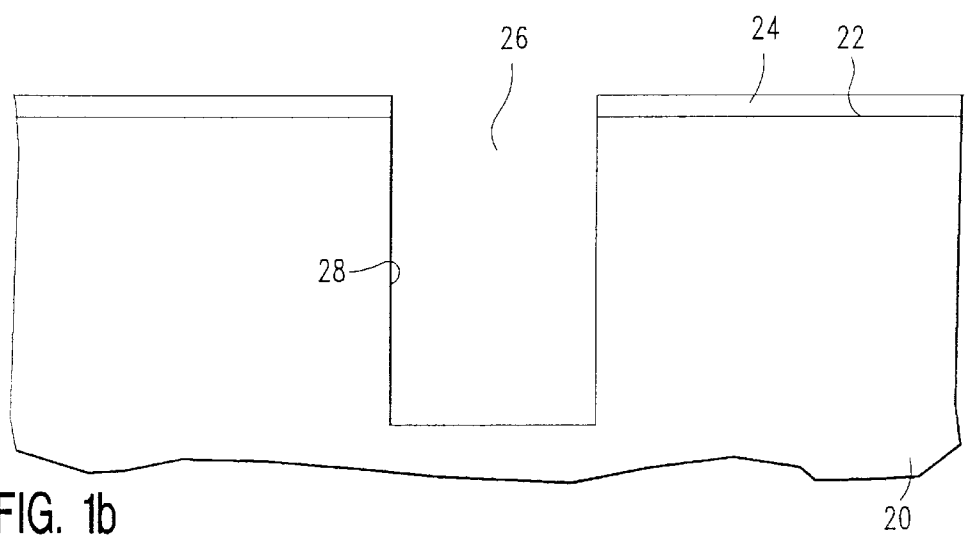
Figure 1C:
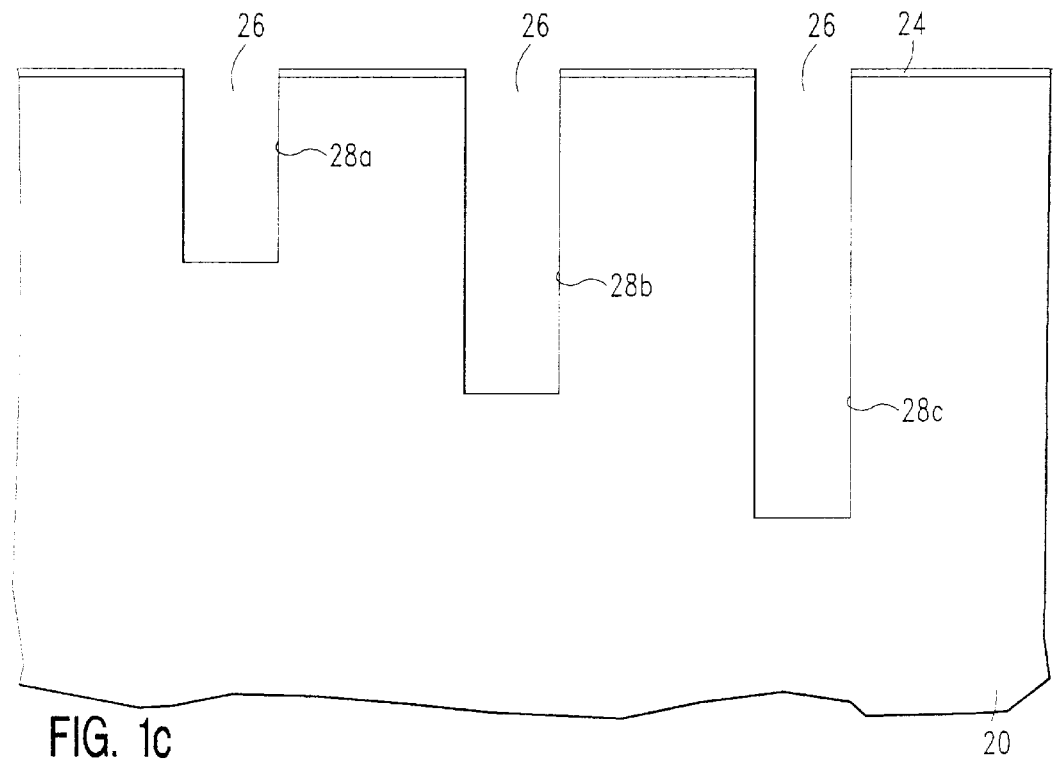

Next, vertical trench 28 is etched in wafer 20 through openings 26 formed in masking layer 24 by known directional etch methods, such as reactive ion etch, as illustrated in FIG. 1b. The formation of vertical trenches is well known in the art. Referring to FIG. 1c, if horizontal trenches at two different depths are desired, an array of trenches 28 are formed, then selected trenches 28 are masked and the vertical trench etch is continued on the unmasked trenches until the latter reach the desired depth. If horizontal trenches at more than two different depths are desired, the masking and etching are repeated, the result being vertical trenches 28a–28c as illustrated in FIG. 1c.

Figure 1D:
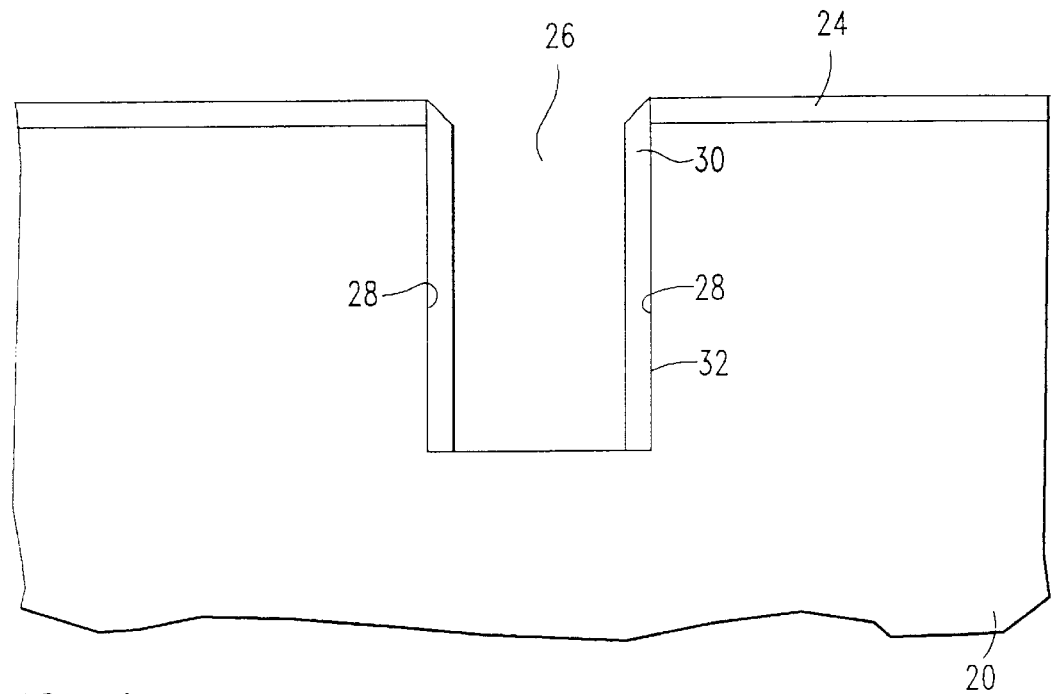

As illustrated in FIG. 1d, etch stop layer 30, formed from materials such as silicon oxide, silicon nitride, or p+ polysilicon, is then formed on sidewalls 32 of trench 28. Etch stop layer 30 is formed by CVD deposition followed by a directional etch that removes etch stop layer 30 from horizontal surfaces but leaves etch stop layer 30 in place on vertical surfaces.

Figure 1E:
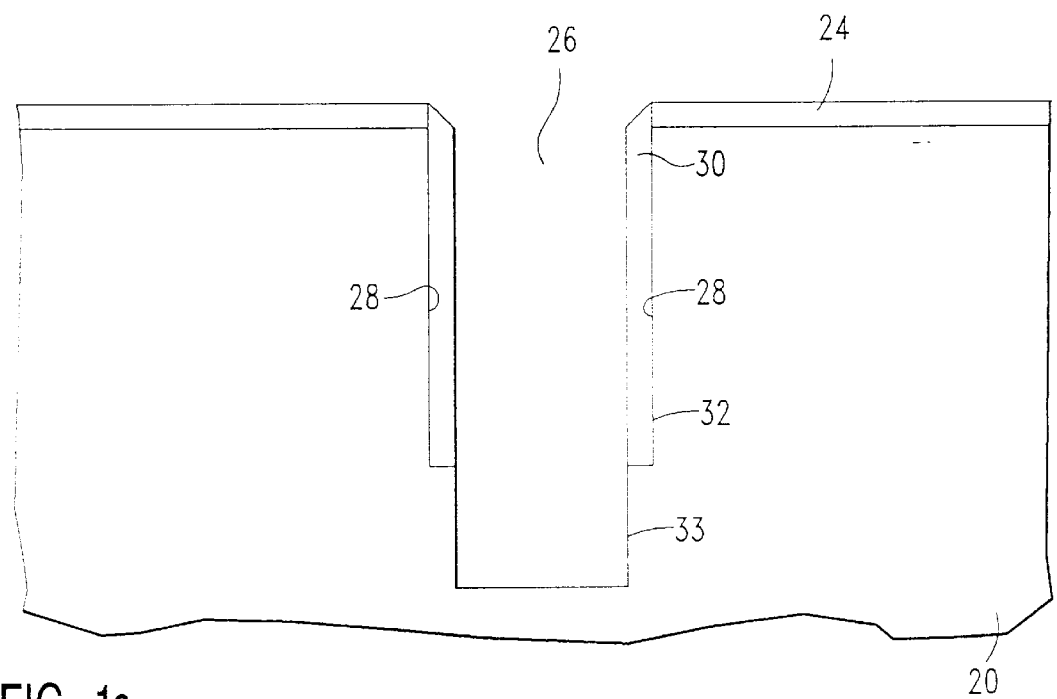

Trench 28 is then etched slightly deeper as illustrated in FIG. 1e exposing additional sidewall 33 below sidewall etch stop layer 30. The depth of this etch defines the minimum height of the horizontal trench formed in the next process step.

This etch is optional and the step can be omitted, in which case the process disclosed in the Kemlage paper discussed above is used to form the horizontal trench. Briefly, this Kemlage process involves using a horizontally preferential etchant to initially etch trench 28 deeper so that it extends below the bottom edge of etch stop layer 30, and then begins to etch horizontally onto the substrate. However, forming the exposed additional sidewall 33 provides a significant and unexpected advantage for process control over the process described in the Kemlage paper. The horizontal etch rate is substantially higher than the vertical etch rate, and in the Kernlage process, horizontal etch is delayed until sufficient vertical etch has occurred to get around etch stop layer 30. The variability of this delay decreases the uniformity of the horizontal etch. By forming exposed additional sidewall 33, delay for vertical etching is avoided, horizontal etching in the next step begins immediately, and the extent of horizontal etching is more easily controlled, and uniformity is substantially improved.

Next an orientation dependent etchant is used. Orientation dependent etchants are more fully described in the Kendall paper and include materials such as KOH and water. A paper by H. Seidel, et. al in J. Electrochem. Soc. Vol 137, No. 11, November 1990, p. 3612, (the first Seidel paper) provides etch rate ratios and process conditions for the different silicon crystal orientations for several etchant solutions. For this application a high anisotropy ratio for the <110> to <111> etch rates is desired:

The first Seidel paper summarizes previous reports that purely inorganic aqueous solutions of KOH and NaOH have been known to etch silicon anisotropically. Improved etching behavior was obtained by the addition of isopropyl alcohol. In general, all aqueous solutions containing hydroxides of other alkali metals, such as LiOH, and CsOH perform in a similar manner. Aqueous solutions of ammonium hydroxide were also reported to etch anisotropically. More complicated derivatives of ammonium hydroxide, e.g., so called quaternary ammonium hydroxides like tetraethyl ammonium hydroxide, and choline can also be used as anisotropic etchants. Solutions consisting of ethylenediamine, water, and pyrocatechol (EDP) are among the most widely employed.

The KOH concentration in weight percent can be in the range of 10–60%. Isopropyl alcohol can be added to a 20% KOH solution according to the following recipe: 1 liter $H_2O$, 312 g KOH, 250 ml isopropyl alcohol. Temperature should be in the range 20° C. to 115° C. In order to maintain etchant composition, vapors should be recondensed in a water cooled reflux condenser. In the case of EDP solutions, an additional nitrogen purge should be applied to prevent changes of the etch properties due to contact with atmospheric nitrogen.

Figure 1F:
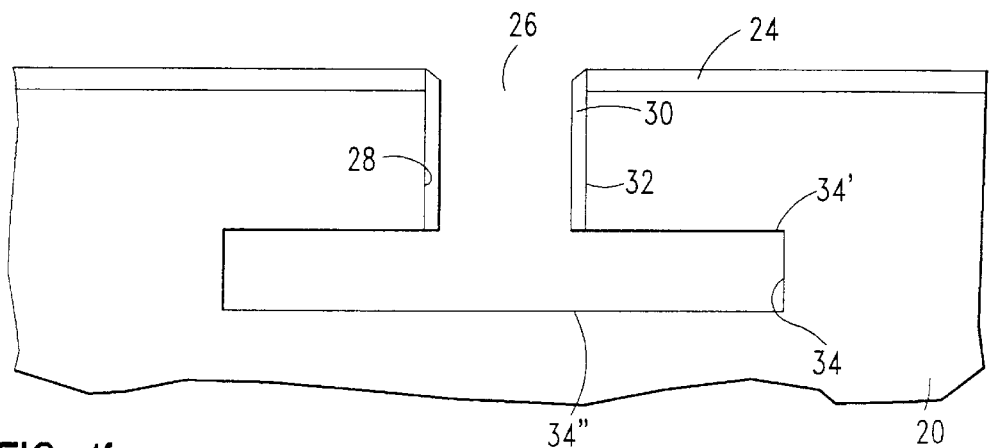

Silicon is etched much more rapidly along the <110> crystal plane than along the <111> with each of these etchants. Reported etch rate ratios vary to as high as 500:1 for the <110> to <111> etch rates in a highly concentrated 55% KOH solution. Thus, in the present invention, etching proceeds rapidly in the horizontal direction in trench 28 and slowly in the vertical direction so that horizontal trench 34 is formed as illustrated in FIG. 1f. Because of the slow vertical etching, horizontal trench 34 has top and bottom walls 34' and 34" that are substantially horizontal.

Figure 1G:
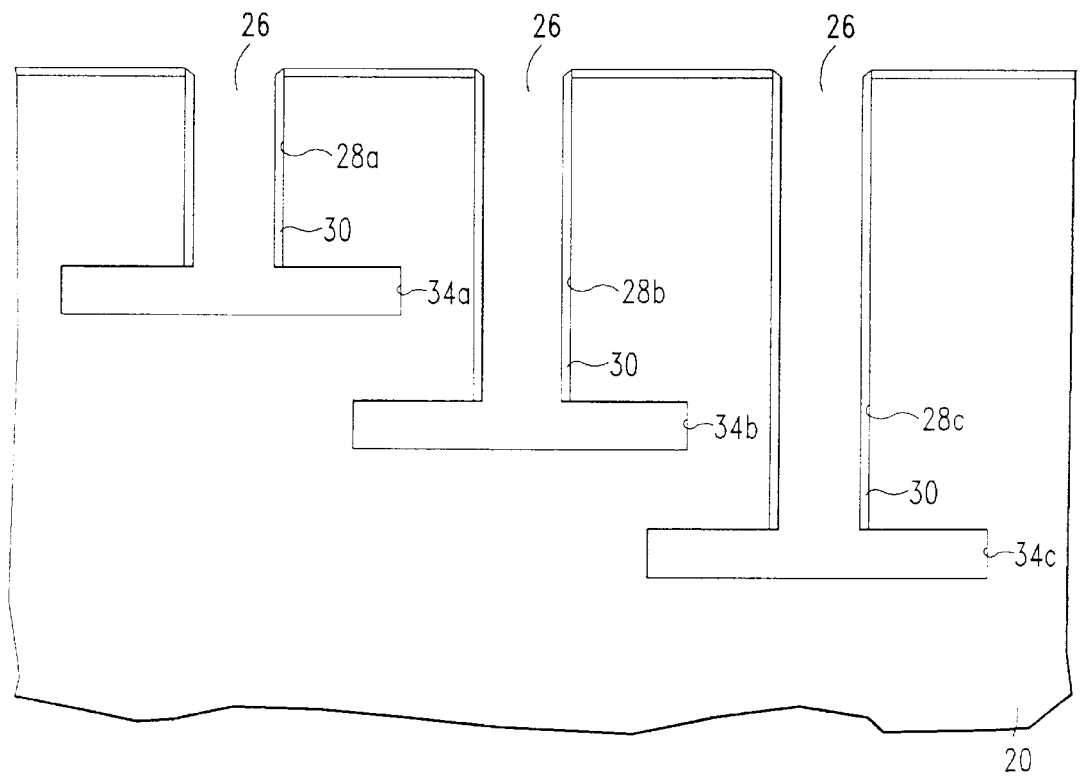
Figure 1H:
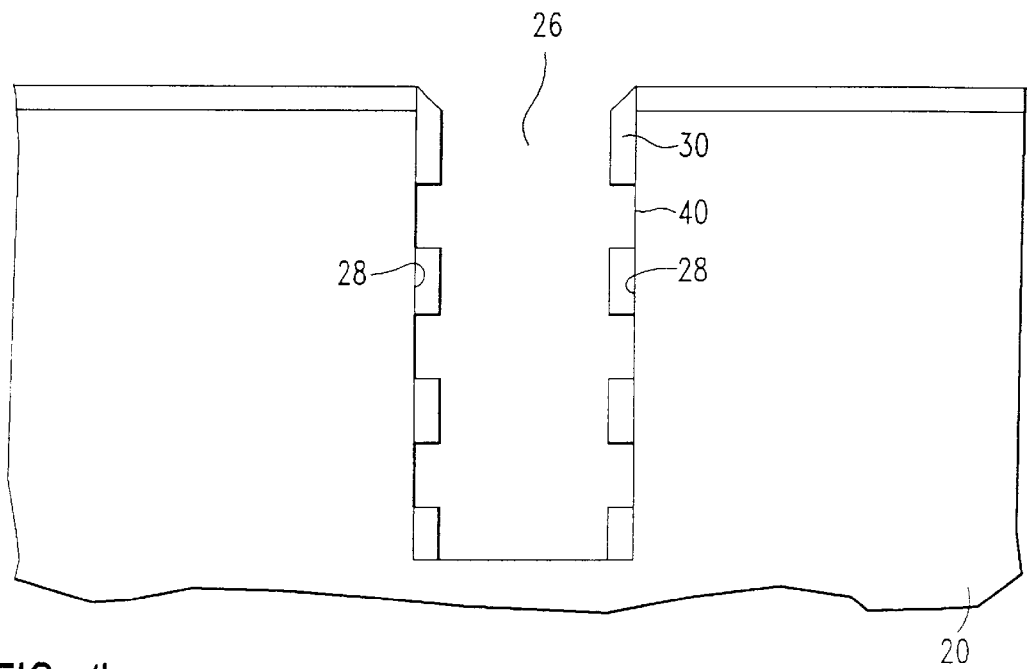
FIGS. 1h–1i are cross-sectional views showing a second set of process steps for making a horizontal trench or stack of trenches by means of a crystallographic orientation dependent etch.
Figure 1I:
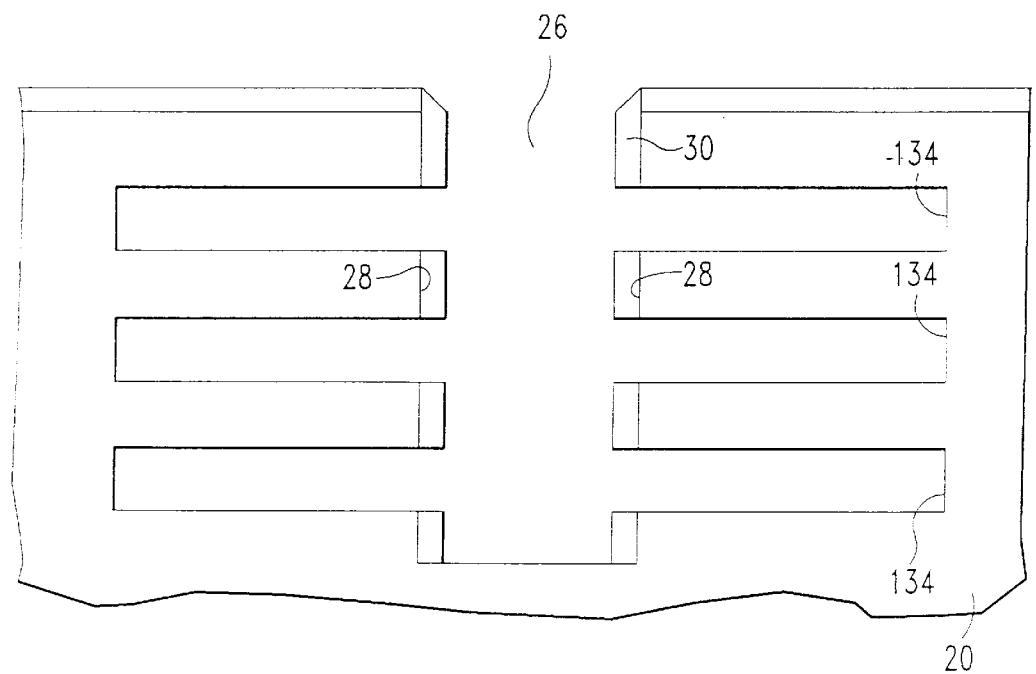

The above process provides a single horizontal trench 34 at the bottom of each vertical trench 28 and provides a stack of horizontal trenches 34a–34c if vertical trenches 28a–28c of several different depths are etched as described hereinabove and as illustrated in FIG. 1g. An alternate method described hereinbelow provides a novel method of forming a horizontal trench or a plurality of horizontal trenches from a single vertical trench. This embodiment also uses a crystallographic etch but instead of a single access to the bulk silicon at the bottom of trench 28, access is obtained by forming a plurality of openings 40 in sidewall etch stop layer 30 at different levels within trench 28 as illustrated in FIG. 1h. A method of forming openings at desired levels in sidewall etch stop layer 30 is described in commonly assigned U.S. Pat. No. 5,096,849 to Beilstein, et. al., incorporated herein by reference. The method is also described in the discussion of FIGS. 6a–6c hereinbelow. Once openings 40 are formed in sidewall etch stop layer 30, the orientation dependent etchant is used as described hereinabove to form the horizontal trenches 134 as illustrated in FIG. 1i.

As mentioned hereinabove, the '987 and '240 patents describe the formation of alternating heavily and lightly doped layers of single crystal silicon and the formation of horizontal trenches by use of an etchant that etches heavily doped silicon much more slowly than lightly doped or intrinsic silicon. Also as mentioned hereinabove, the '240 patent, incorporated herein by reference, further describes the formation of horizontal trenches by use of an etchant under bias that etches p− or p+ doped silicon much more slowly than n doped silicon. However, a method of etching so as to leave n− doped silicon does not appear to have been disclosed. A paper by H. Seidel, et al in J. Electrochem. Soc. Vol 137, No. 11, November 1990, p. 3626, (the second Seidel paper) provides etch rate ratios as a function of dopant concentration for several etchant formulations and doping levels. Dopants include boron and phosphorous. Horizontal trenches so formed would have only very heavily doped layers remaining. While heavily doped layers are suitable for capacitors, practical transistors require relatively lightly doped base or channel regions. What is needed for device fabrication is means to etch heavily doped regions while leaving lightly doped n and p regions in place.

The inventor of the present invention has found a second method of forming the horizontal trench that solves this problem using a doping dependent porous silicon etch, as illustrated in FIGS. 2a–2d. In the first step, heavily doped layer 50 is formed by methods including ion implantation, conventional epitaxial growth, and UHV-CVD epitaxy. Dopant is introduced either during the epitaxial growth step (in-situ) or dopant is introduced by implantation or diffusion after the layer is formed. In-situ doping produces a blanket layer of doping. Implantation or diffusion of each layer permits masking and control over the shape of both the doped region and the trench subsequently etched from it.

Doping levels for boron should be in the range of at least $3 \times 10^{19}$ to provide a sufficient etch rate ratio between heavily and lightly doped layers. Boron doping of $1 \times 10^{20}$ or more is preferred.

Figure 2A:
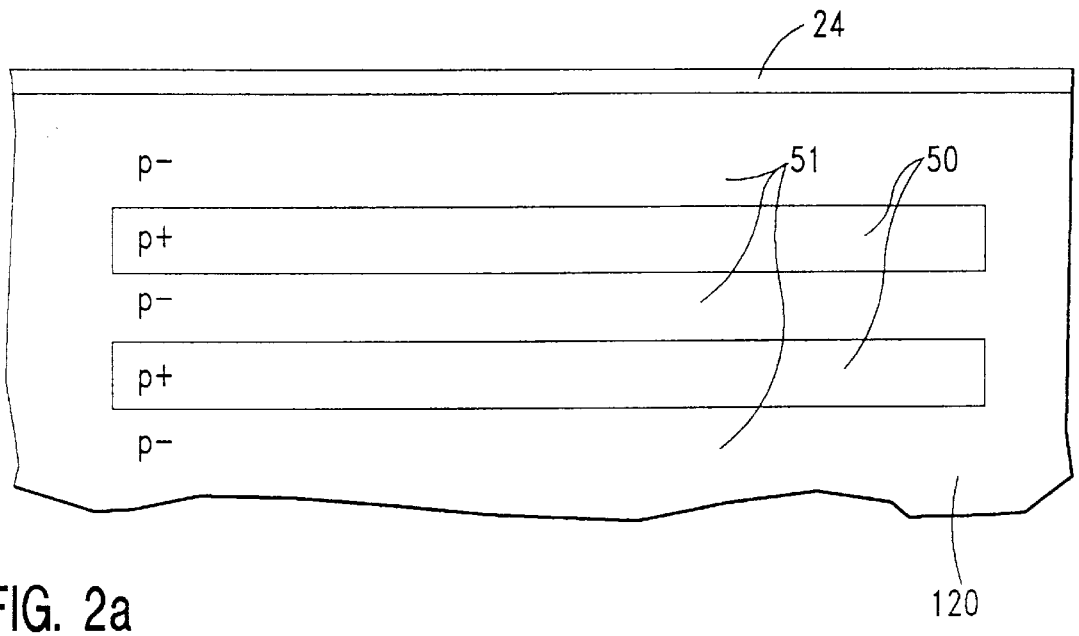
FIGS. 2a–2d are cross-sectional views showing a set of process steps for making a horizontal trench or stack of trenches by means of a porous silicon etch.
Figure 2B:
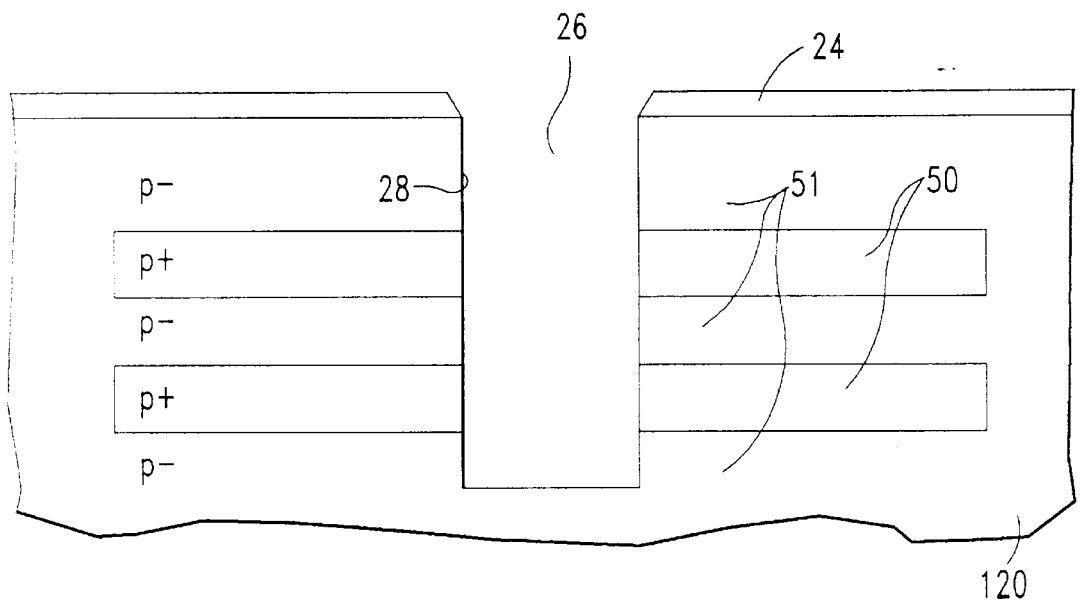

Layers 51 located above and below heavily doped layer 50 are left undoped or lightly doped, as illustrated in FIG. 2a. Lightly doped layers 51 are outside the range of the heavy implant described hereinabove or are regions masked during the implant. Lightly doped layers 51 are also formed by methods including conventional epitaxial growth and UHV-CVD in which little or no dopant is introduced during the growth step. The regions may be masked during subsequent implantation or diffusion steps or are at a depth beyond the range of the implant or diffusion. Attack by the porous silicon etchant is avoided if the doping is no more than about $10^{16}/cm^3$, more preferably about $1–2 \times 10^{15}/cm^3$. However, the doping of lightly doped layers 51 need not be that low to form horizontal trenches. The doping of lightly doped layers 51 should be at least about 100, more prefer-ably 1000 times less than the doping of heavily doped layer 50 to obtain a porous silicon etch rate ratio in which heavily doped layer 50 is attacked significantly faster than lightly doped layers 51.

Heavily and lightly doped layers 50 and 51 can be formed in alternating layers to provide a stack of horizontal trenches as illustrated in FIGS. 2a–2d. It is preferred that the doping step illustrated in FIG. 2a be performed before wafer surface topology changes much from horizontal so the doping layer and horizontal trench are substantially horizontal. It is also preferred that the top layer in the stack be lightly doped.

Structures such as n/p+/p− and p−/p+ /p− are suitable. Vertical trenches are formed as described hereinabove and illustrated in FIG. 2b, extending to or through doped layer or layers 50.

Figure 2C:
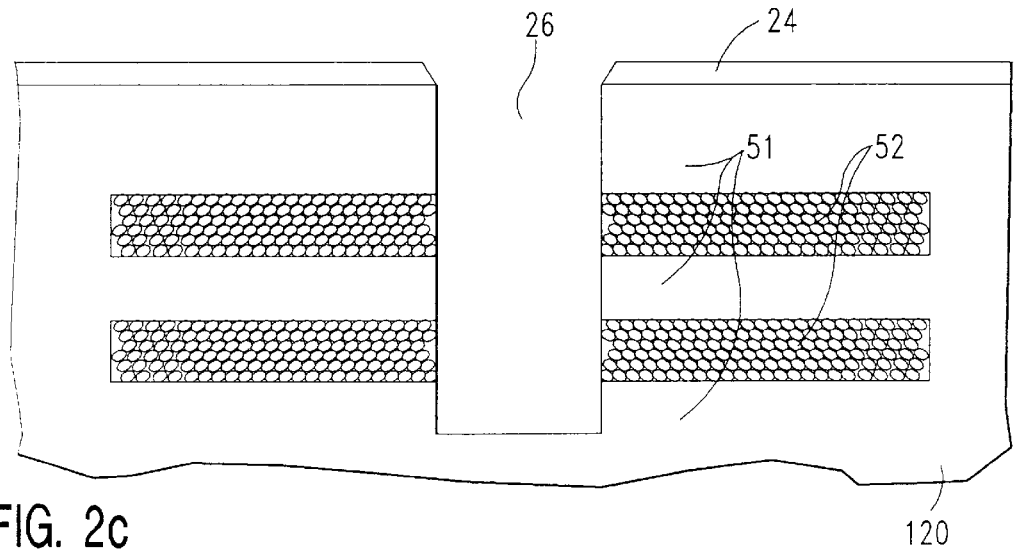

After the formation of trench 28 intersecting p+ doped layers 50, porous silicon 52 is formed preferentially in p+ doped layers 50 as illustrated in FIG. 2c. Porous silicon is formed by anodizing in hydrofluoric acid, a method well known in the art Typical conditions are described in a paper by S. S. Tsao in J. Appl. Phys. 62(10), 11-15-87, p. 4182 (the Tsao paper). The use of porous silicon is also described in commonly assigned U.S. Pat. No. 3,919,060 to Pogge, et al., incorporated herein by reference.

Anodization can be performed in a single-tank vertical cell in which aqueous hydrofluoric-acetic acid serves as the electrolyte. Wafer backs are aluminized to give good ohmic contacts. Applied currents range from 25 to 100 mA. Anodization provides a lateral porous silicon penetration rate of about one micrometer/minute. Depending on the anodization conditions and silicon doping levels, 5% to 95% dense porous silicon with pore diameter in the range 10–1000 A can be formed.

Unlike the standard dopant-selective etch, porous silicon etch is preferential to heavily boron-doped layers 50. Furthermore, the horizontal extent and geometry of the porous silicon can be limited either by masking during the p+ implant or by methods including controlling time for the anodizing step. It is best to limit the etch so that porous silicon layers formed from adjacent trenches do not butt against each other.

Figure 2D:
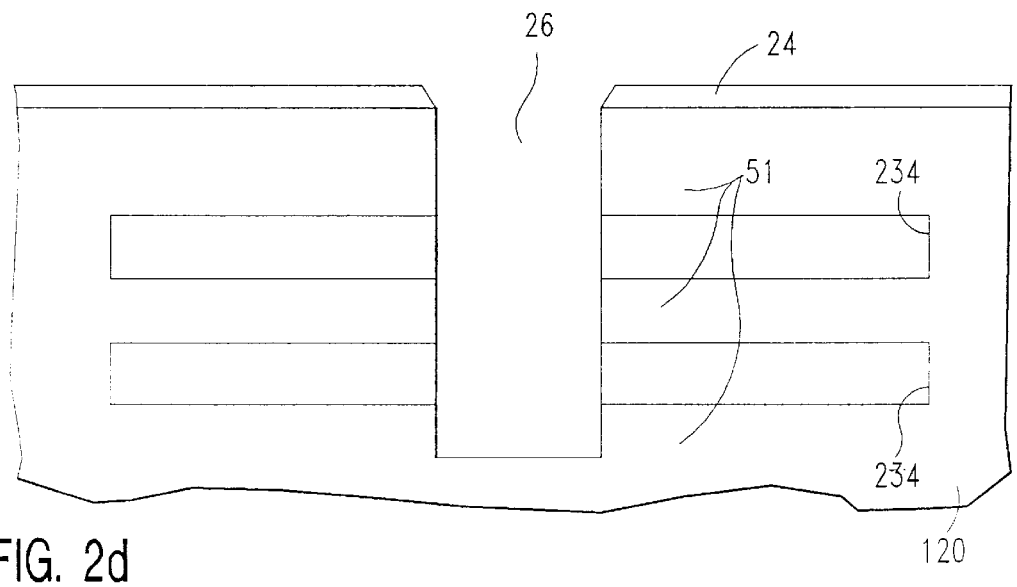

After porous silicon 52 is formed horizontal trench 234 is formed by etching away the porous silicon using methods such as an isotropic etchant or an alkaline etchant as described hereinabove. Since the wall thickness of porous silicon is small, a very small amount of heavily doped material need be removed to completely etch out the porous silicon matrix, leaving empty horizontal trench 234 or trenches 234 as illustrated in FIG. 2d. Alternatively, the porous silicon is oxidized and the oxide etched in aqueous HF. The oxidation is carried out in a dry or steam ambient at a temperature in the range 900–1000° C.

Figure 3A:
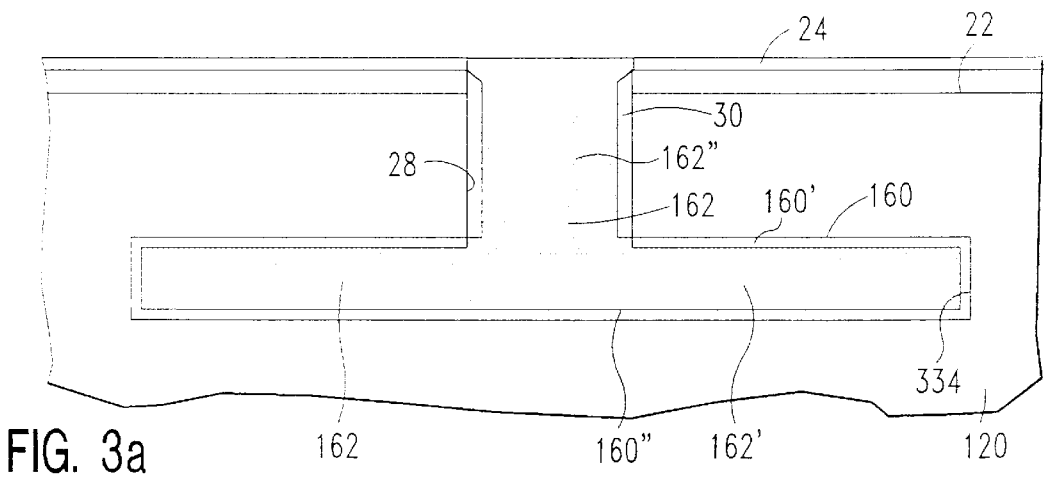
FIGS. 3a and 3c–3g are cross-sectional views showing a set of process steps for making an FET or stack of FETs within and adjacent a horizontal trench in the single crystal substrate.

Process steps to form FETs and stacks of FETs, starting with horizontal trench 334 formed by methods such as described hereinabove (as in FIGS. 1a–1i), are illustrated in FIGS. 3a–3j. As a first step, gate insulating layer 160 is formed on the silicon surfaces of horizontal trench 334 to a thickness of 50 to 150 A as illustrated in FIG. 3a. Layer 160 is formed by methods known in the art, such as thermal oxidation of the silicon surface of trench 334. Layer 160 can also be formed of materials such as silicon nitride or high index materials such as tantalum pentoxide.

Gate conductor 162 is then deposited on gate insulating layer 160. Gate conductor 162 is formed from a material such as a doped semiconductor, including doped polysilicon or doped amorphous silicon, or one of the refractory metals, such as tungsten, that has a melting point above semiconductor processing temperatures. Doped polysilicon is deposited using processes such as in-situ doped chemical vapor deposition (CVD), a process known in the art in which the doping is provided during the deposition. Tungsten is also deposited from a chemical vapor deposition process known in the art. It is also possible that the gate conductor will be deposited after hot processing is complete, in which case ordinary metals, like aluminum, can be used. The structure illustrated in FIG. 3a is a simple conductor-insulator-semiconductor device that can be used as a capacitor having gate conductor 162 and substrate 120 as electrodes.

Gate conductor 162 includes horizontal portion 162' within horizontal trench 334 and vertical portion 162" within vertical trench 28. Vertical portion 162" provides means to contact horizontal portion 162' of gate conductor 162 from wafer surface 22 or the top of masking layer 24. If needed, additional contacts to gate conductor 162 are formed (not shown) by etching vertical trenches to gate insulator 160, depositing an insulator, and then performing a directional etch to open up contact through horizontal portions of the insulator and through gate dielectric 160' to horizontal portion 162' of gate conductor 162 within the horizontal trench.

Starting from the structure in FIG. 3a and illustrated in FIG. 3b–3j are steps for forming source and drain diffusions and isolation regions for a stack of two CMOS FETs, both sharing the same gate conductor 162. The stack could form the pair of FETs needed for an invertor, a basic CMOS building block. A single FET of either p-channel or n-channel type can of course be formed by following the process steps hereinbelow but omitting steps required only for the unwanted diffusions. It is clear to one skilled in the art that the location of p and n type dopants can be reversed and several methods for the formation of each can be used.

Figure 3B:
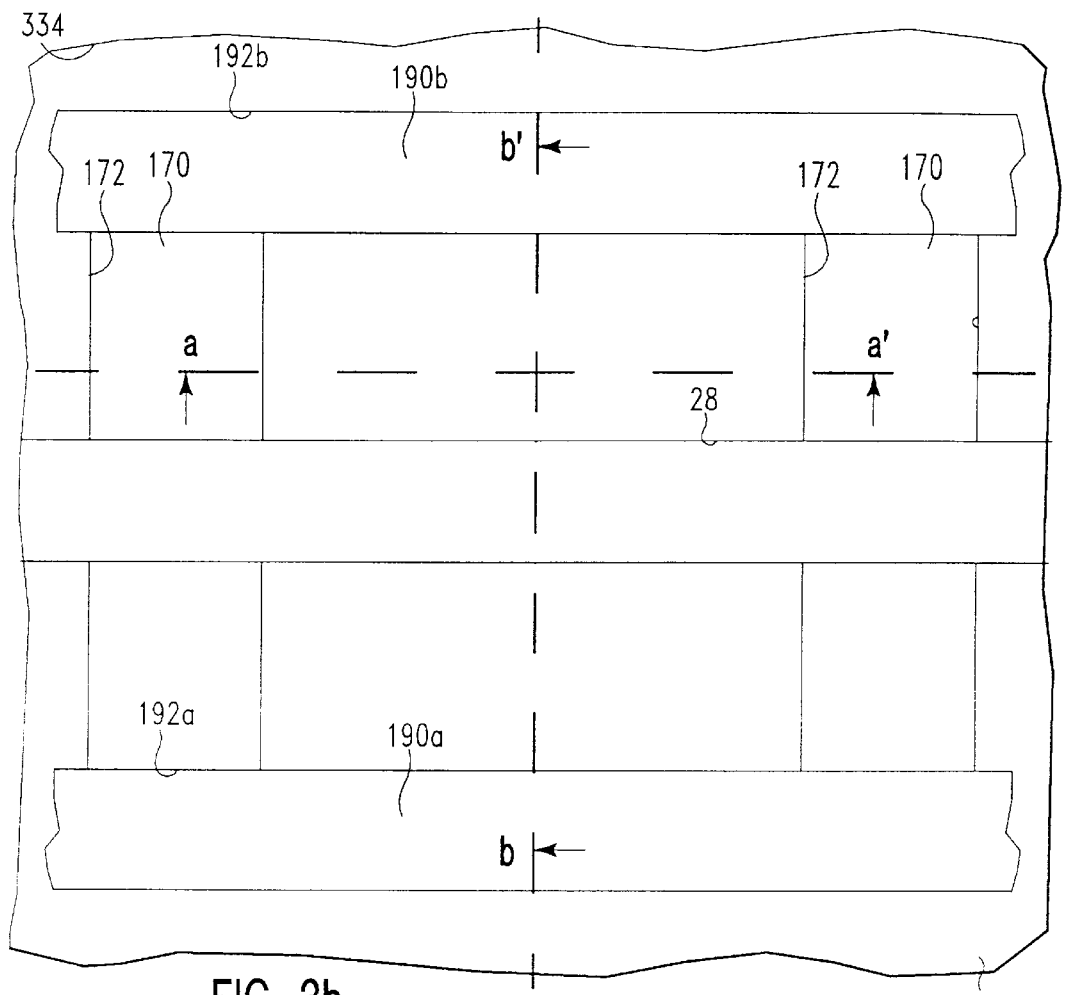
FIG. 3b is a plan view of an FET formed adjacent a horizontal trench in a single crystal substrate.
Figure 3C:
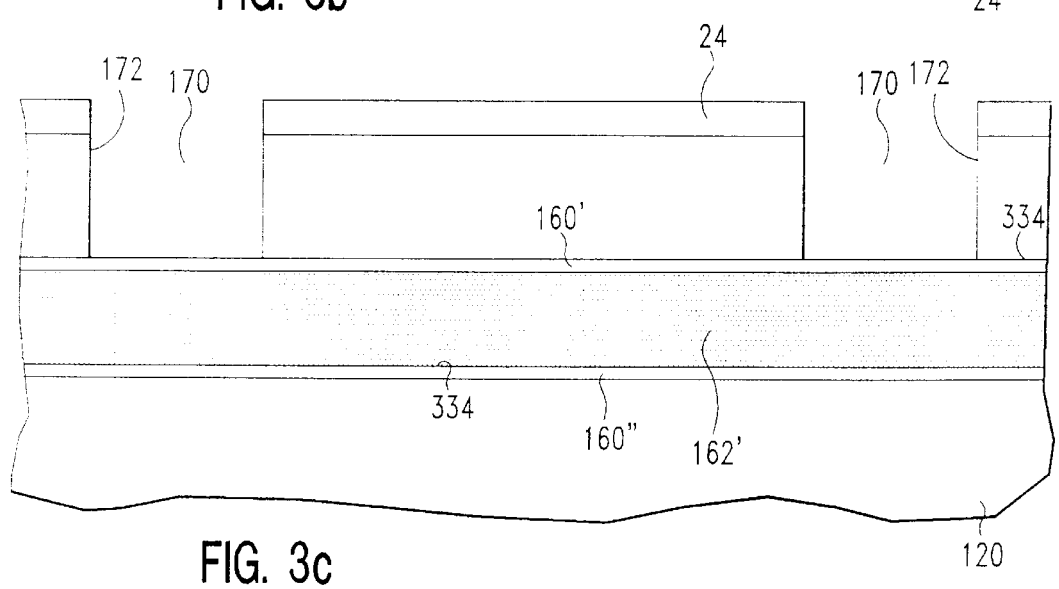

In the first step for forming source or drain diffusions, openings 170 are photolithographically formed in masking layer 24 as illustrated in plan view in FIG. 3b and in cross section a-a' shown in FIG. 3c. Next, source/drain vertical trench 172 is etched in wafer 120 through openings 170 in masking layer 24, stopping on top gate insulator 160'. Source/drain vertical trench 172 is formed by directional etch methods, such as reactive ion etch, known in the art, as described hereinabove for trench 28.

Figure 3D:
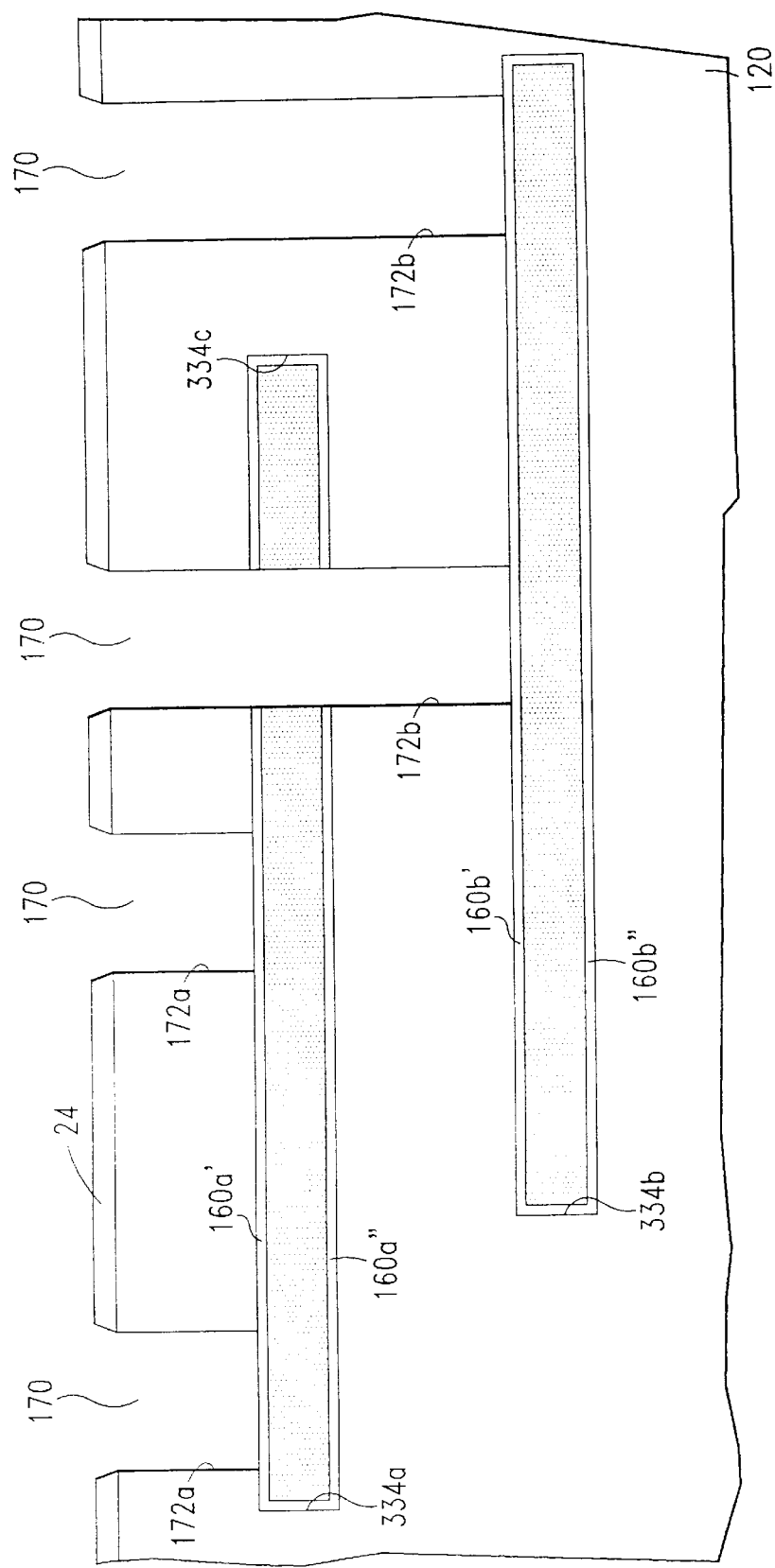

As illustrated in FIG. 3d, if source and drain contacts for FETs located at horizontal trenches 334a and 334b of two different depths are desired, a portion of an array of source/drain vertical trenches 172a is masked to protect top gate insulator 160a', and the vertical trench etch is continued on the remainder of the source/drain vertical trenches 172b, stopping on top gate insulator 160b'. If contacts for FETs located at horizontal trenches of more than two different depths are desired, the masking and etching are repeated, the result being vertical trenches 172 with several different depths within the substrate. FIG. 3d also illustrates a floating gate device having horizontal trench segment 334c by forming vertical trench 172b that isolates segment 334c of horizontal trench 334a. For clarity, the remainder of the process is illustrated hereinbelow for a single gate conductor in a single horizontal trench but it is understood that the process steps described hereinbelow could be used to form FET diffusions at horizontal trenches at a plurality of depths simultaneously.

Figure 3E:
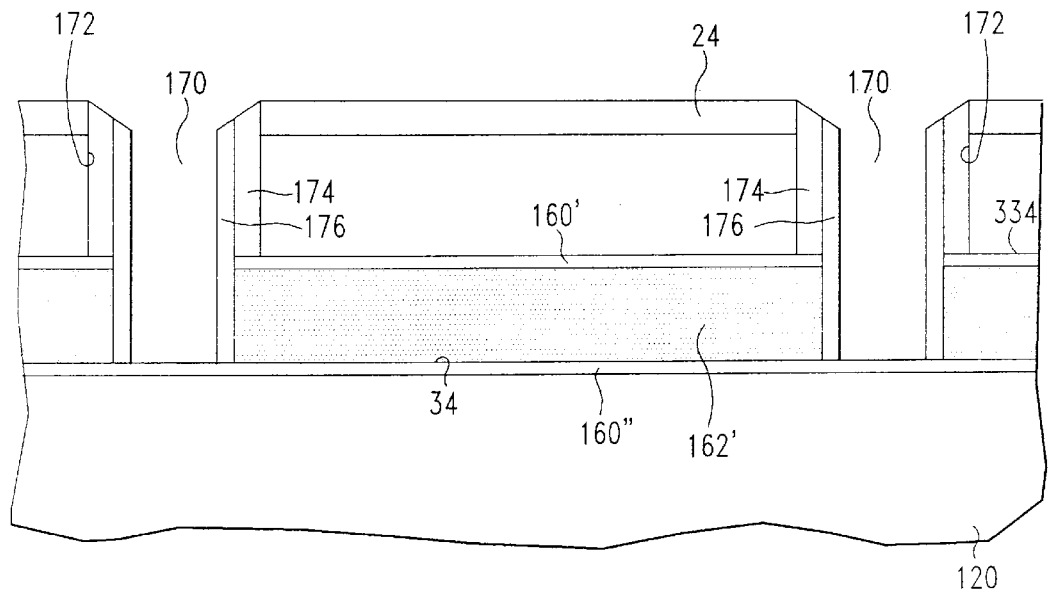

As illustrated in FIG. 3e, layer 174, formed from materials such as boron doped glass, doped polysilicon, silicon oxide, or silicon nitride, is formed on sidewalls of trench 172. Layer 174 is formed by CVD deposition followed by a directional etch that removes layer 174 from horizontal surfaces but leaves layer 174 in place on vertical surfaces. Boron doped glass is preferred since the glass is a source of boron for later out diffusion to form a p+ source and drain of a p channel device above horizontal portion 162' of gate conductor 162.

In the next step, also shown in FIG. 3e, vertical trench 172 is extended by directional etch through top gate insulator 160' and horizontal portion 162' of gate conductor 162, stopping on bottom gate insulator 160". Gate contact vertical trench 28 and vertical portion 162" (FIG. 3a) of gate conductor 162 are masked during this etch. Insulating gate sidewall spacer 176 is then deposited and a directional etch is used to remove spacer 176 from horizontal surfaces, leaving spacer 176 only on vertical surfaces as illustrated in FIG. 3e. Gate sidewall spacer 176 is formed from materials including silicon dioxide, and silicon nitride.

Figure 3F:
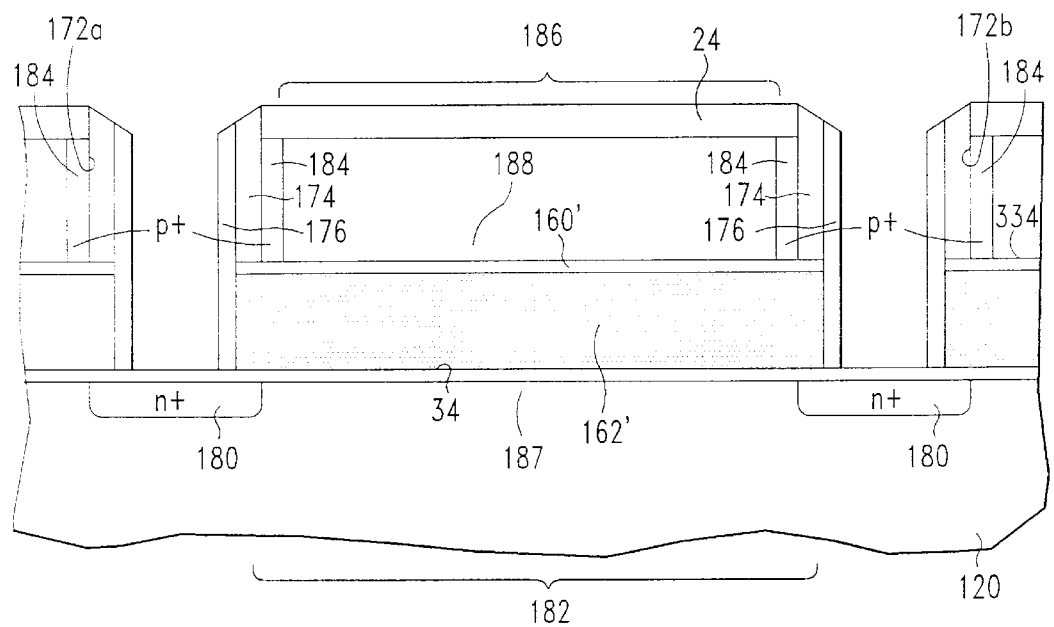

The result of ion implanting an n type dopant, such as arsenic, in the next step is to form n+ source and drain regions 180 as illustrated in FIG. 3f. Also shown is the result of a high temperature anneal that removes implant damage and activates dopant in n+ source and drain regions 180 of n-channel transistor 182. That anneal also diffuses dopant from layer 174 to form p+ source and drain regions 184 above horizontal portion 162' of gate conductor 162 and to form p-channel transistor 186. Thus, channel regions 187 and 188 for both transistors 182 and 186 are defined simultaneously. P+ source and drain regions 184 of transistor 186 could also be formed by methods including ion implantation. Similarly heavily doped regions of transistor 182 could be formed by diffusion from a doped glass or doped polysilicon.

Figure 3G:
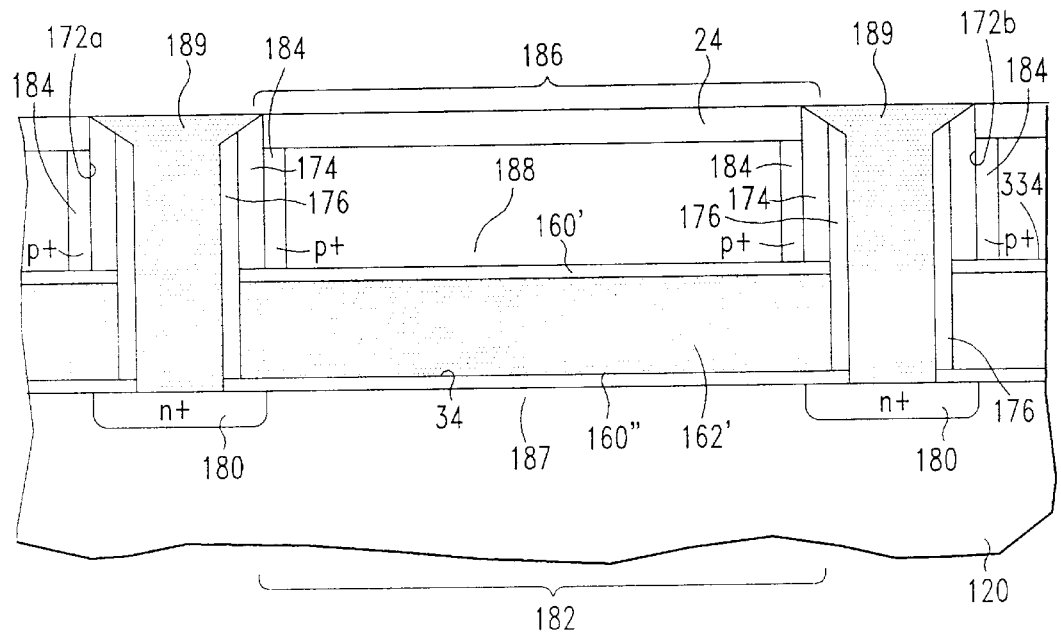

As illustrated in FIG. 3g, exposed portions of bottom gate dielectric 160" above heavily doped source and drain regions 180 are then etched by wet or dry techniques known in the art. A conductive material is then deposited to form contacts to regions 180. The contacts can be bordered or borderless. For example, to form a borderless contact, conductive material 189 is deposited in trenches 172 making contact to regions 180 by methods such as chemical vapor deposition and then the polysilicon is etched or polished back. Standard methods are then used to form interconnects to other devices at the surface. Alternatively, a horizontal connector described hereinbelow (FIG. 9) is used to interconnect transistors below the surface of the silicon. The formation of ohmic contacts to source and drain regions 184 of transistor 186 are described below (FIG. 4a–d). Materials for the contacts to source and drain regions include those described above for gate conductor 162.

Figure 3H:
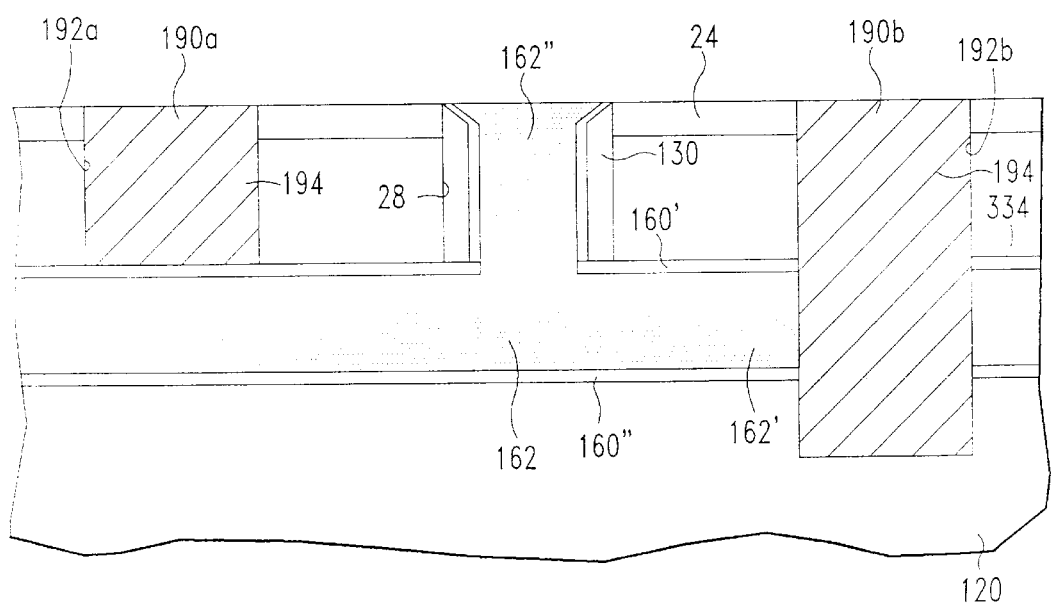
FIG. 3h is a cross sectional view of a stack of FETs formed with either common or separate gates in a horizontal trench in the single crystal substrate.

Openings 190a and 190b in masking layer 24 are next formed for isolation trenches 192 illustrated in plan view in FIG. 3b and in cross section b-b' shown in FIG. 3h. Trenches 192a and 192b of different depths are formed by trench etching methods similar to those described hereinabove for source-drain trenches. For the pair of FETs sharing a common gate shown in FIG. 3f, three depths of isolation are useful, the two as shown in FIG. 3h and a third, intermediate level, stopping on bottom gate dielectric 160" (not shown). Isolation trench 192a isolates top transistor 186 (FIGS. 3f–3h); isolation trench 192b isolates top transistor 186, cuts horizontal portion 162' of gate conductor 162 and isolates bottom transistor 182 (FIGS. 3f–3h). The trenches are filled with insulation 194 to passivate exposed sidewalls of trench 192 and planarize surface 196 of wafer 120.

FIGS. 3f–3h illustrate an FET that is just one of several types of three-terminal devices that can be formed within and adjacent a horizontal trench. A wide range of three-terminal devices are known in the art and can be substituted for the FET. Generally, a three terminal device comprises a first electrode that provides carriers, a second electrode that receives the carriers, a carrier conduction region between the first and second electrode, and a control electrode that controls the flow of carriers in the carrier conduction region. In the case of an FET, the first and second electrode are the source and drain, the carrier conduction region is the channel region, and the control electrode is the gate.

Figure 3I:
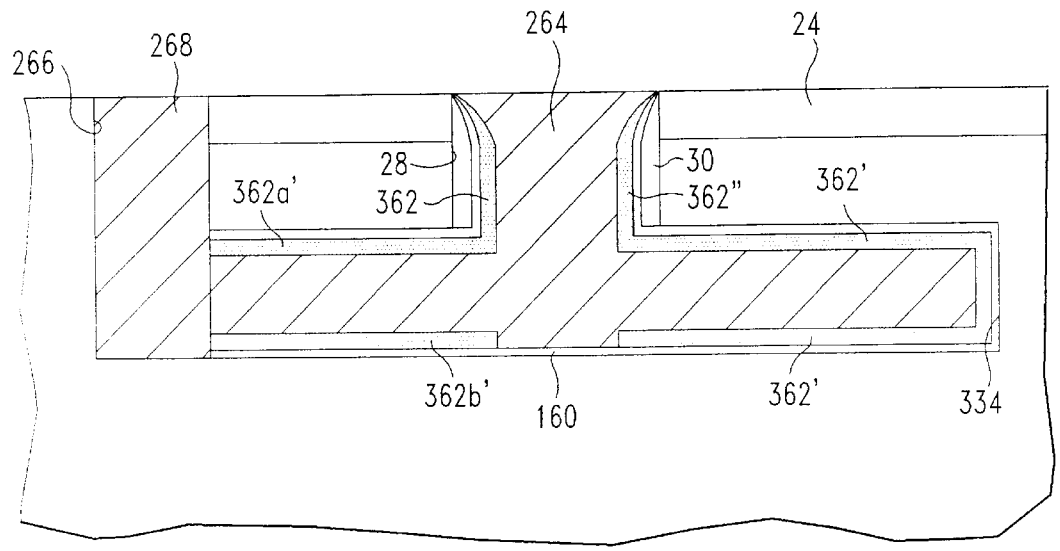
FIG. 3i is a cross sectional view of a double gated FET formed with either common or separate gates in a horizontal trench in the single crystal substrate.

An alternate embodiment of stacked FETs is illustrated in FIG. 3i in which gate dielectric 160 is formed on surfaces of horizontal trench 334 as described hereinabove (see discussion of FIG. 3a). Then gate conductor 362 is deposited as described hereinabove, but in a thin layer so horizontal trench 334 is not filled. A thin film of gate conductor 362 provides the option of forming top and bottom FETs with independent gates. A RIE etch then cuts through exposed horizontal portions of gate conductor 362 separating left and right horizontal devices. Remaining portions of trench 28 are then filled with insulator 264. Insulator 264 includes materials such as CVD oxide, CVD nitride, or spin-on plastic, such as polyimide. Alternatively, insulator 264 is replaced with a combination of a thin insulating layer followed by a CVD poly or metal fill of remaining space. The left side of FIG. 3i illustrates a configuration with gates vertically displaced with respect to each other and the right side illustrates a common gate configuration. To form vertically displaced gates, isolation trench 266 is etched, cutting connection between top 362a' and bottom 362b' portions of gate conductor 362. Isolation trench 266 is filled with dielectric 268 formed from materials such as CVD silicon oxide or silicon nitride, or a combination of dielectrics and polysilicon by means known in the art. The isolation trench is formed at any step after gate conductor is deposited. Source and drain diffusions (not shown) are formed as described hereinabove. Contact to top gate conductor 362a' and bottom gate conductor 362b' is by methods such as a vertical trench as described hereinabove.

Figure 3J:
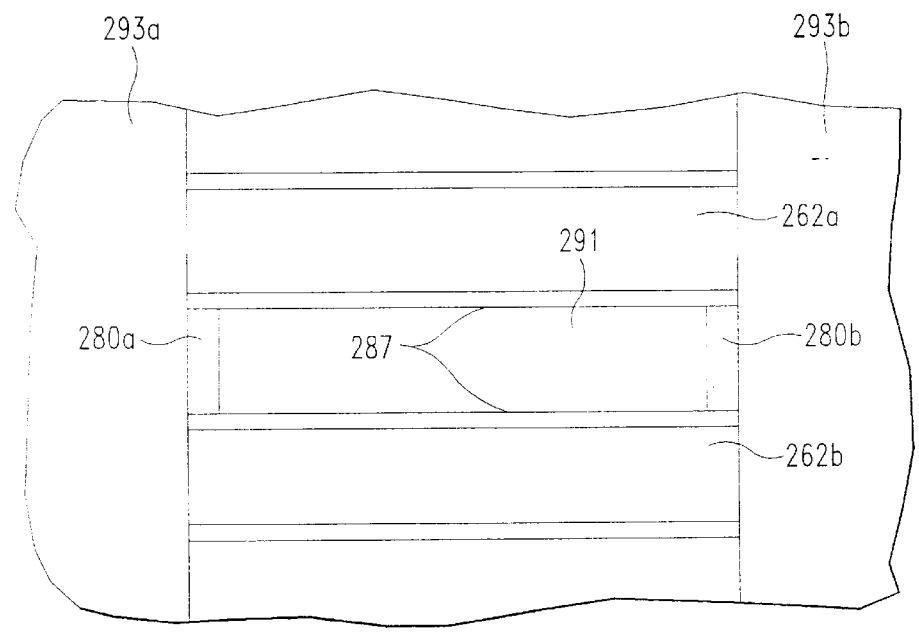
FIG. 3j is a cross sectional view of a double gated FET formed with either common or separate gates in two horizontal trenches in the single crystal substrate.

A double gated device is illustrated in FIG. 3j, the device having gates 262a and 262b, source and drain diffusions 280a and 280b, and channel regions 287 in body region 291. Diffusions 280a and 280b are formed adjacent vertical trenches 293a and 293b. The device can be fully depleted if body region 291 is sufficiently thin. Contact to the gates and diffusions can each be formed in a separate trench as described above, or multiple contacts can be formed in a trench by methods as described below and illustrated in FIGS. 4–6.

Subsurface stacked FETs 182 and 186 with common gate conductor 162 illustrated in FIG. 3f can be wired in several configurations, including an invertor, a standard CMOS building block. Steps for fabricating invertor connections are illustrated in FIGS. 4a–4d.

Figure 4A:
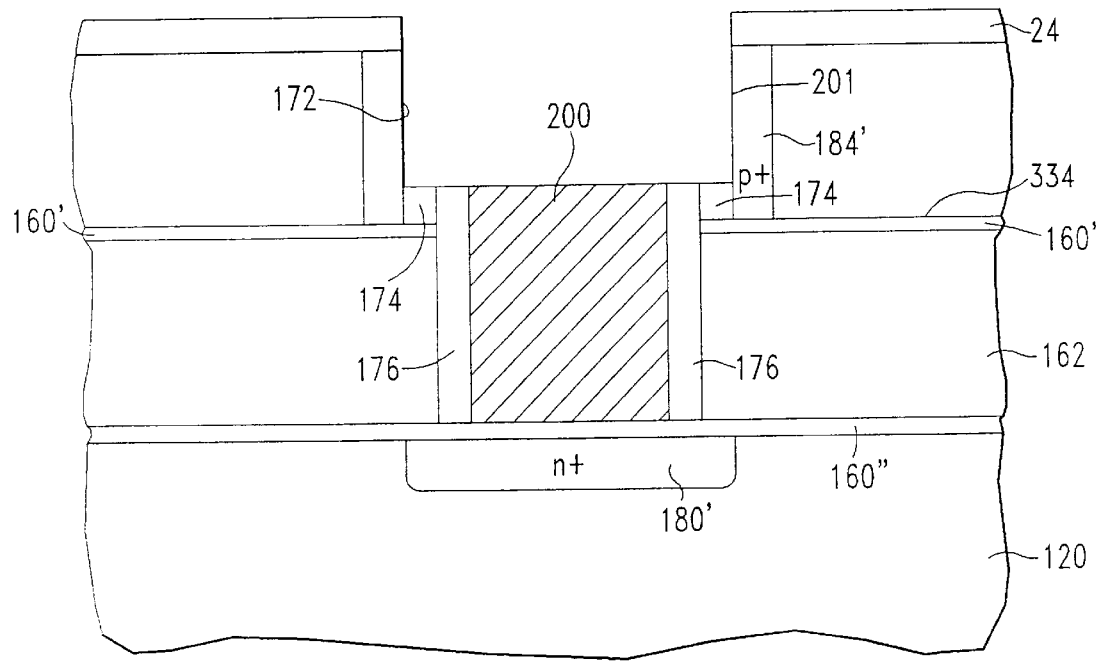
FIGS. 4a–4d are cross-sectional views showing a set of process steps for making a vertical conductor connecting heavily doped regions of an FET or stacked FETs and for making a CMOS invertor or stack of CMOS invertors within the single crystal substrate.

In the first step of forming an invertor, source/drain vertical trench 172 (as formed in FIG. 3f is filled with etch stop layer 200, as shown in FIG. 4a. Etch stop layer 200 is formed from materials with different etch properties than spacer 176 and layer 174, such as resist, parylene, and polysilicon. Etch stop layer 200 is then etched back to expose a portion of spacer 176 and layer 174 above the level of gate insulator 160'. Sidewall spacer 176 and layer 174 are then both etched by means such as an isotropic etchant, such as aqueous HF, opening contact 201 to p+ doped region 184'.

Masking layer 24 is either formed from a material with etch properties such that it is little etched, or has greater thickness than the removed portions of sidewall insulator 176 and layer 174 to avoid removal of masking layer 24 during the removal of the former layers. Masking layer 24 is formed from silicon nitride or is formed with a cap of silicon nitride.

Figure 4B:
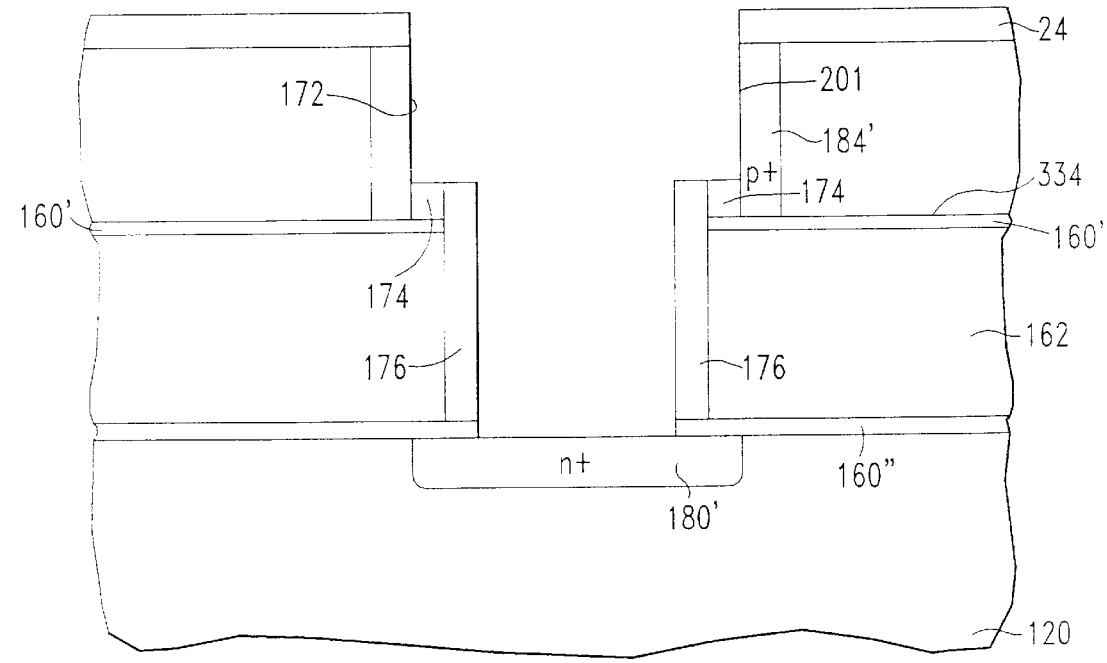
Figure 4C:
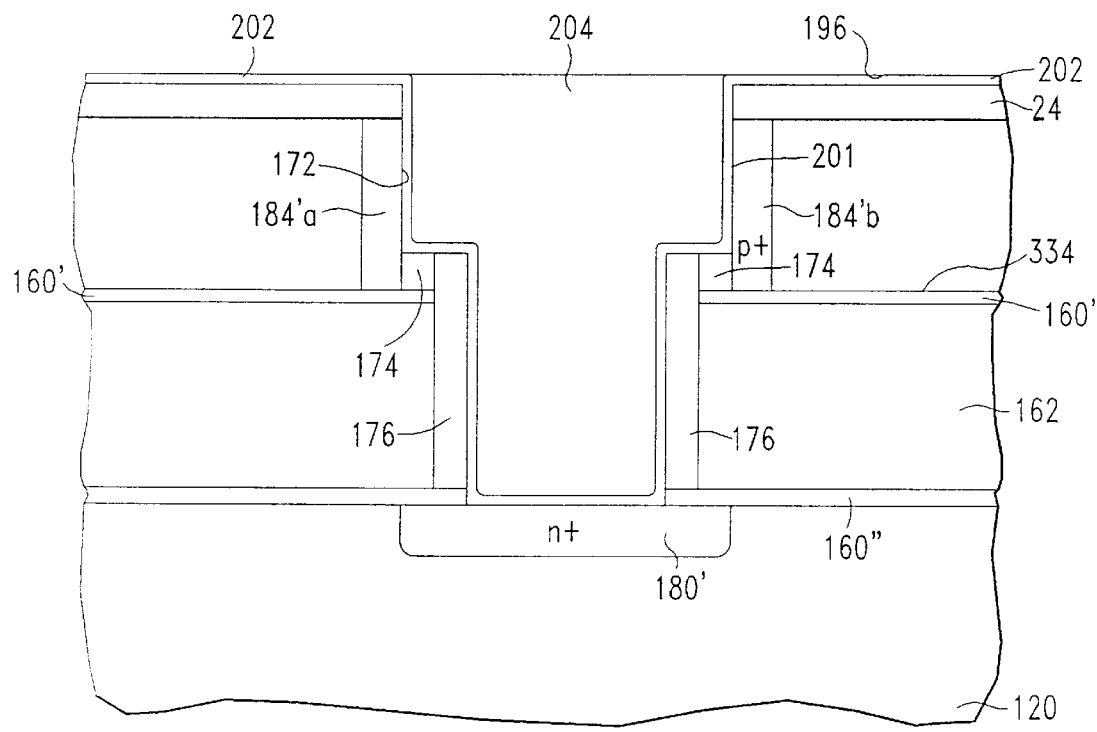
Figure 4D:
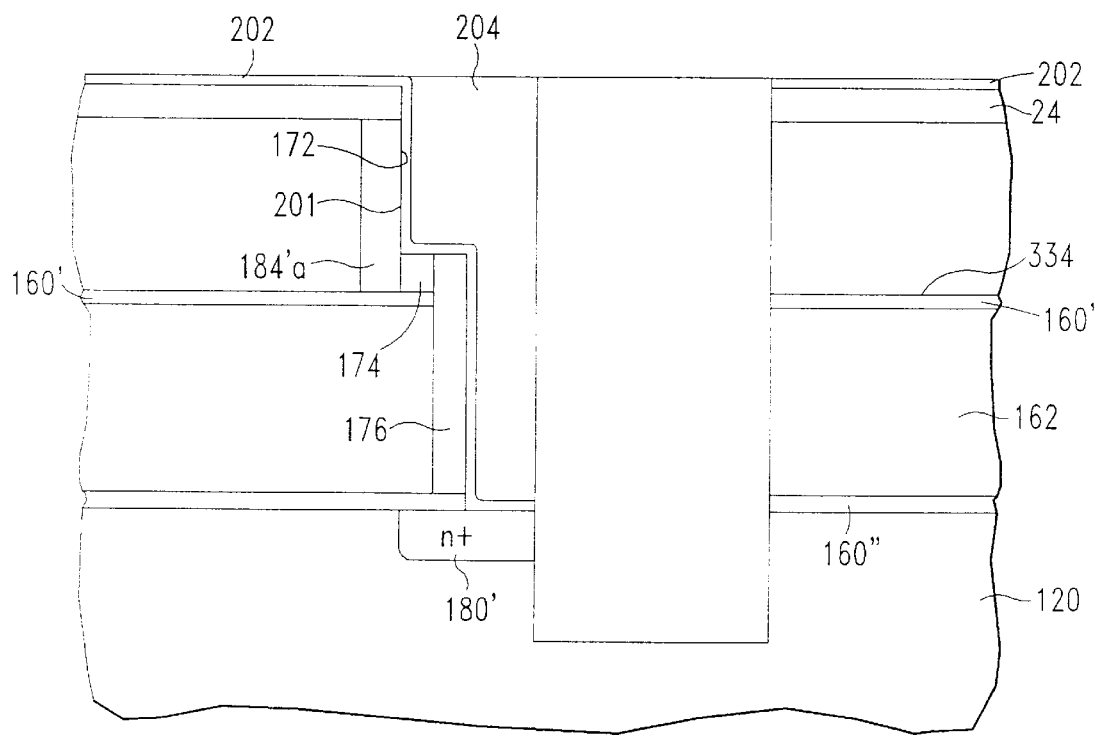

A contact exclusively with p+ doped region 184' can be formed if conductor 202, illustrated in FIGS. 4c and 4d, is deposited after the step shown in FIG. 4a. Or p+ doped region 184' can be interconnected with n+ layer 180' as described below.

In the next step, illustrated in FIG. 4b, etch stop layer 200 is removed and exposed portions of gate dielectric 160" are etched. Then vertical conductor 202 interconnecting n+ doped region 180' and p+ doped region 184' is deposited as illustrated in FIG. 4c. Vertical conductor 202 is formed from materials such as TiN, doped semiconductor, such as doped polysilicon or doped amorphous silicon, a silicide, such as titanium silicide, tungsten silicide, or cobalt silicide, and a refractory metal, such as tungsten, titanium, or molybdenum, by methods such as chemical vapor deposition. When contacting both n and p junctions in the same trench, a layer of TiN is first deposited and the remainder of the trench can be filled with polysilicon. Vertical conductor 202 can also be formed as a strap interconnecting n+ doped region 180' and p+ doped region 184'. If formed as a strap, fill layer 204 formed from polysilicon or insulation is formed on vertical conductor 202 to planarize surface 196 of wafer 120.

Shorting between adjacent p+ doped regions 184a' and 184b' above gates at the same source/drain trench 172 is avoided by forming isolation trench 206 as illustrated in FIG. 4d with structure and methods as described hereinabove as illustrated in FIG. 3g. Alternatively, isolation trench 206 can be formed earlier in the process, such as before n+ doped region 180' is formed.

If doped polysilicon is used for vertical conductor 202, it is important that ohmic contacts be achieved at both p+ and n+ diffusions. TiN is a material that makes good ohmic contact at both diffusion types. TiN also has the property of not diffusing into silicon and its use avoids deeper junctions and device performance degradation. Thus, a layer of a material like TiN formed between n+ doped region 180' and conductor 202 and between p+ diffused layer 184' and conductor 202 provides for ohmic contacts between both doped regions and doped polysilicon conductor 202.

Figure 5A:
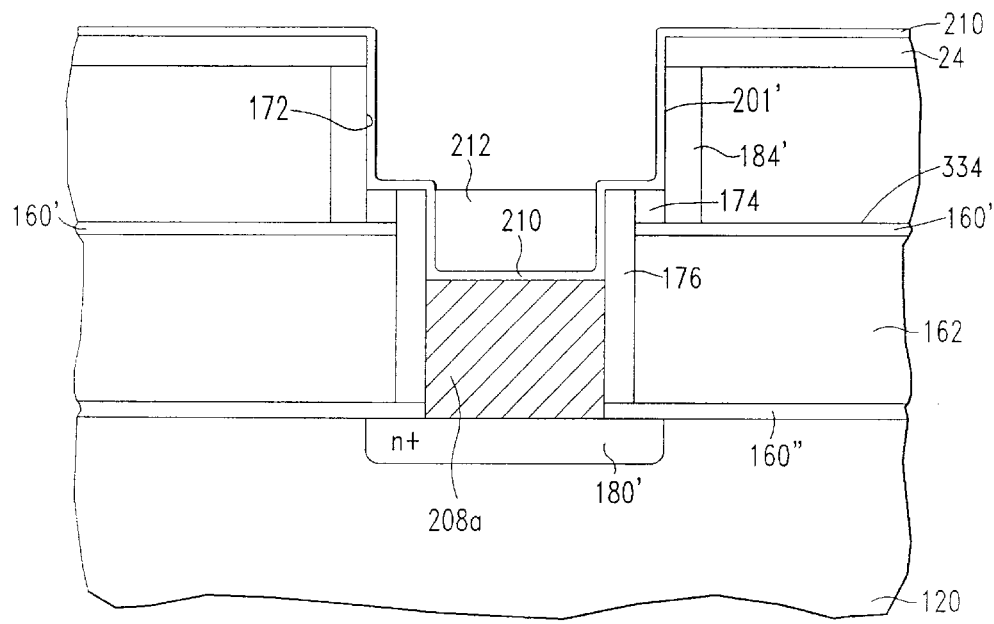
FIGS. 5a–5d are cross-sectional views showing a set of process steps for making separate contacts to heavily doped regions of two transistors intersecting a single trench.

Input to and output from the invertor can be formed through two trenches, one to the n+ diffusion and the other to the p+ diffusion, as described hereinabove (FIGS. 3g and 4a). It is also possible to provide two contacts in a single trench as illustrated in FIGS. 5a–5d. A first conductive layer is deposited, and then first portion 208a of this first conductive layer is etched back below contact opening 201 to p+ doped region 184' as illustrated in FIG. 5a. A layer of insulator 210 is then deposited. Resist 212 is then deposited and etched back to a level below contact opening 201 to p+ doped region 184'.

Figure 5B:
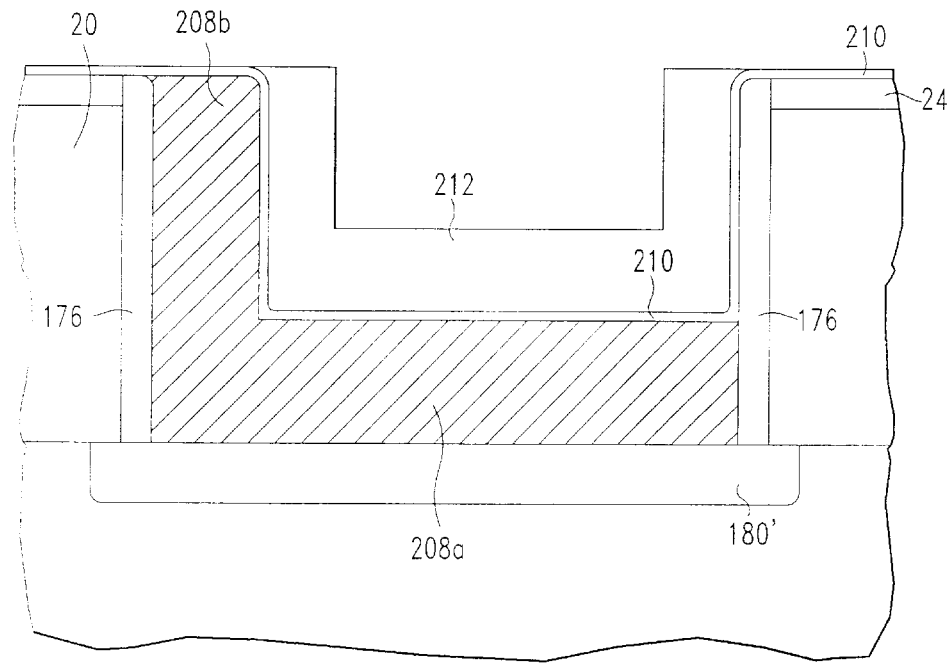

As illustrated in FIG. 5b, second portion 208b of the first conductive layer is protected during the etch of first portion 208a by a block out mask. Since second portion 208b is not etched it is accessible for contact at the surface. FIG. 5b shows a longitudinal cross section through trench 172 at the same step illustrated in transverse cross section in FIG. 5a. Contact to second portion 208b is seen to be available at one end of the trench.

Figure 5C:
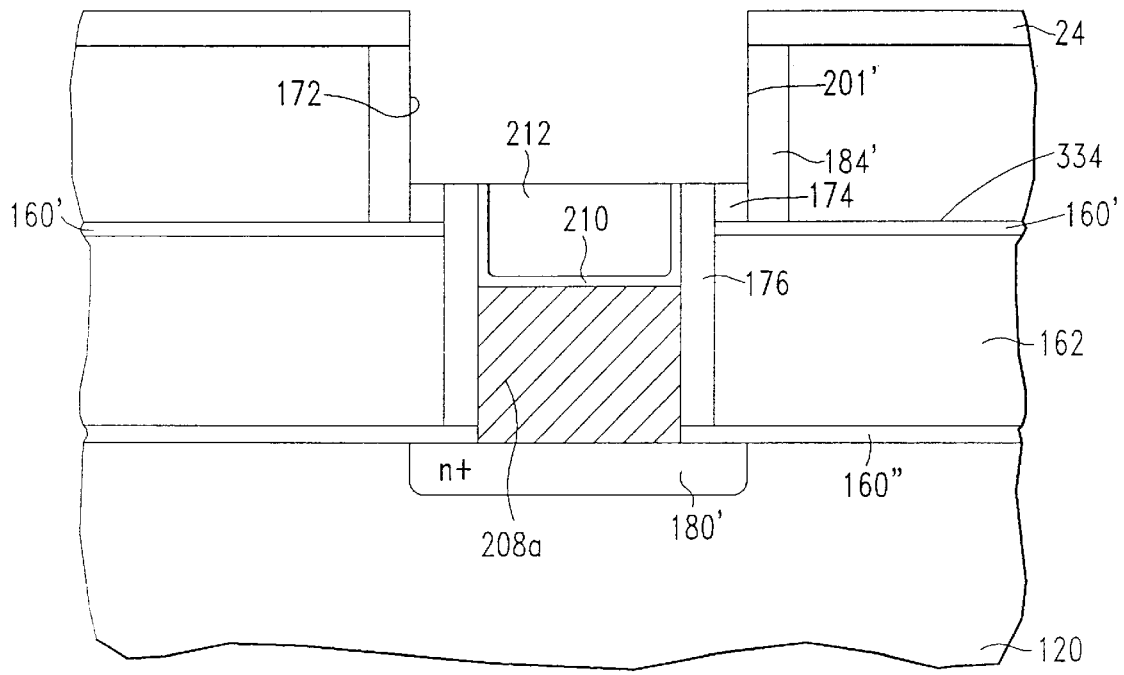
Figure 5D:
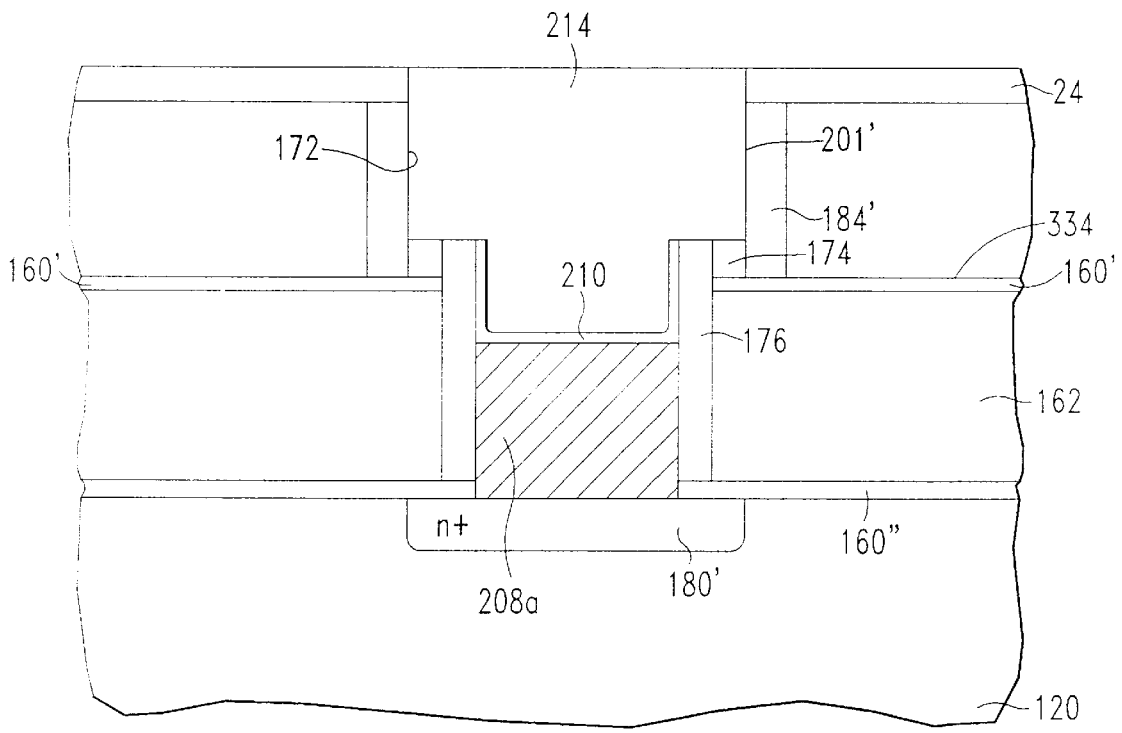

Insulator 210 is then etched where it is unprotected by resist 212 as illustrated in FIG. 5c forming new opening 201' to p+ doped region 184'. Resist 212 is then removed and second conductive layer 214 is deposited in contact with opening 201' to p+ doped region 184' as illustrated in FIG. 5d. Second conductive layer 214 may be restricted to trench 172 by planarizing, forming a self-aligned contact. A standard contact to the surface portion of conductive layer 214 may then be made. Second conductive layer 214 may also extend out of trench 172 to make contact with an external circuit (not shown). For an invertor, this external circuit would be either a power supply high or a power supply ground voltage bus. The opposite power supply bus contacts first conductive layer 208b.

Figure 6A:
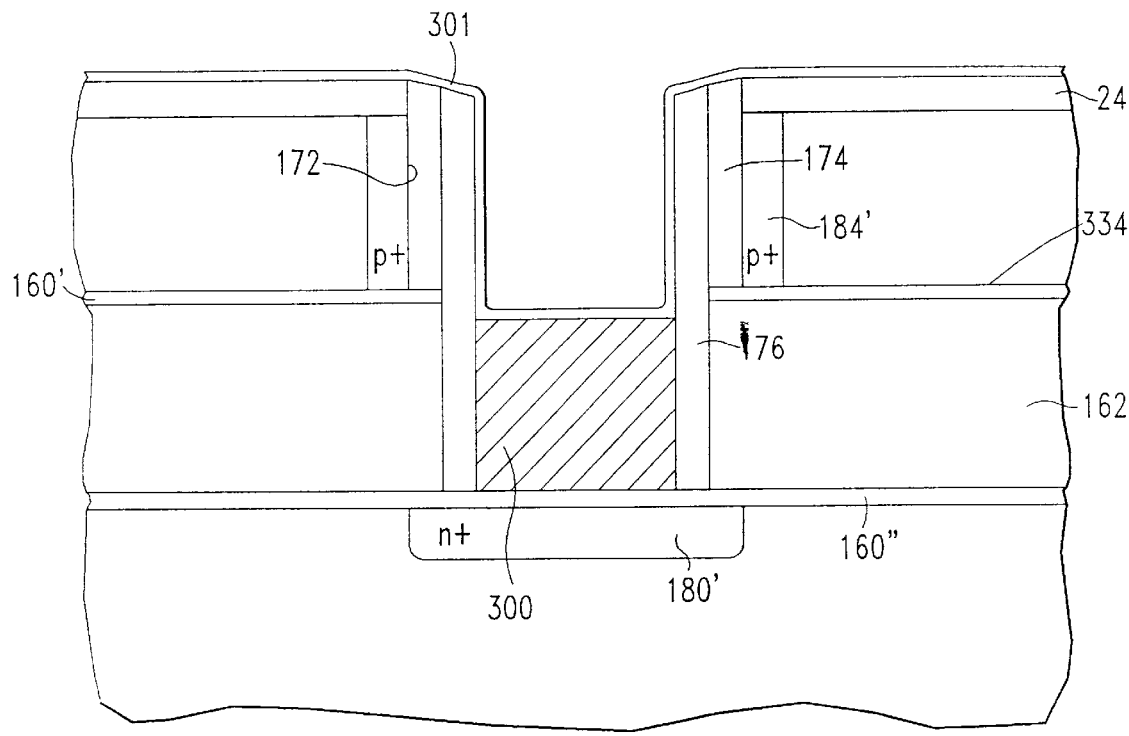
FIGS. 6a–6d are cross sectional views showing a set of process steps for making a vertical conductor between a gate and a source.
Figure 6B:
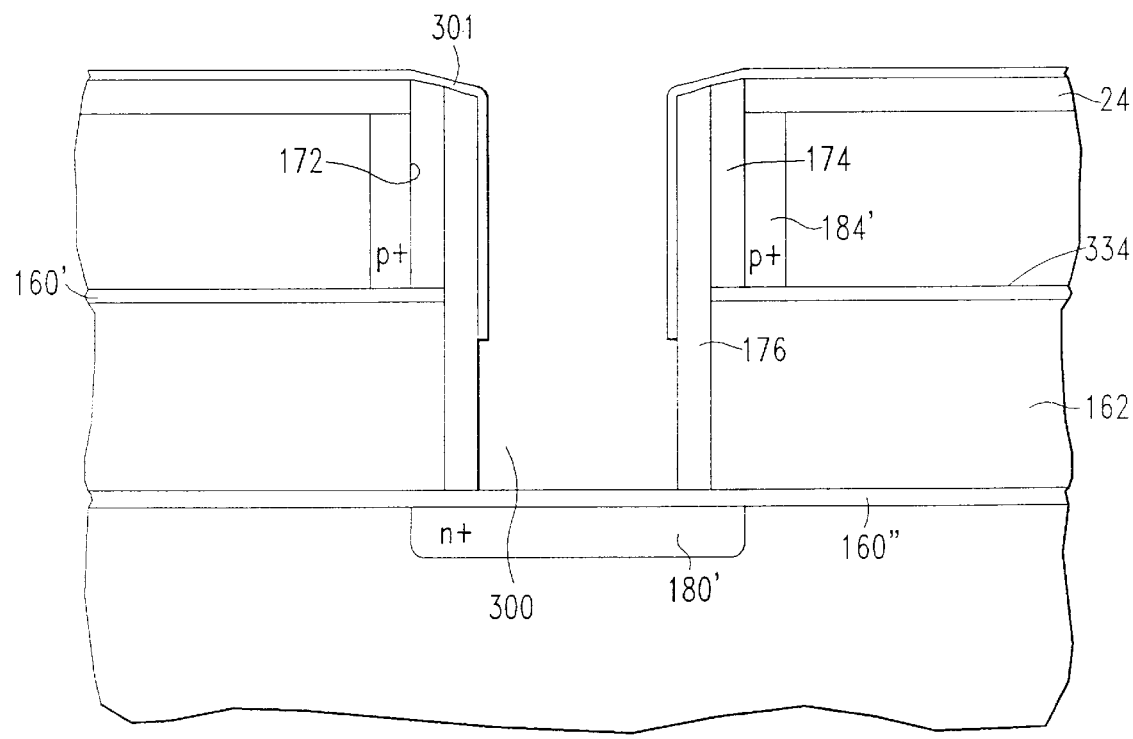
Figure 6C:
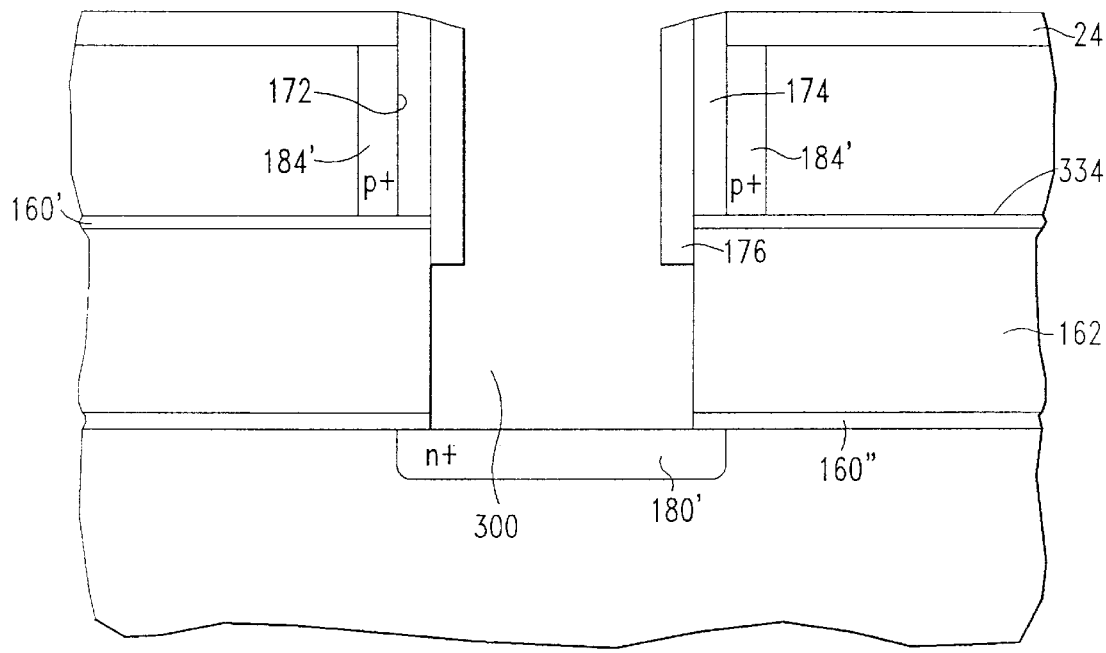
Figure 6D:
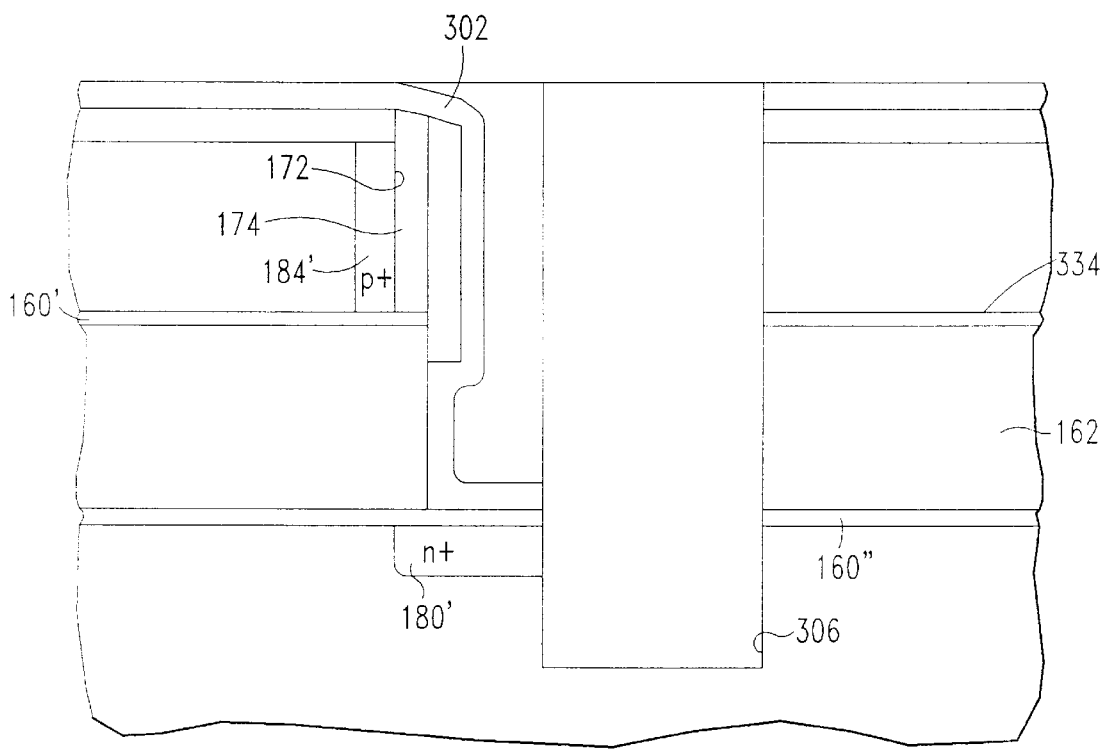

A similar process as described hereinabove for vertical conductor 202 for an invertor circuit is used to form a gate to source contact as illustrated in FIGS. 6a–6d. In this case, first etch stop layer 300 is deposited and etched back to a depth below the level of top gate dielectric 160' as illustrated in FIG. 6a. Next, second etch stop layer 301 is deposited. Second etch stop layer 301 is spacer etched as described hereinabove, and first etch stop layer 300 is removed, leaving second etch stop layer 301 on all vertical surfaces except those that had been coated by first etch stop layer 300 as illustrated in FIG. 6b. Now an isotropic etch is used to remove exposed portions of sidewall insulator 176 opening contact to gate conductor 162 as illustrated in FIG. 6c. The etch also removes the exposed portion of gate dielectric 162. Second etch stop layer 301 is then removed. The process described above and illustrated in FIGS. 4b–4d in the discussion of vertical conductor 202 for the invertor is then used for forming vertical conductor 302, this time between gate conductor 162 and n+ doped region 180' as illustrated in FIG. 6d. A similar method is used for forming other vertical conductors between two layers.

A vertical conductor between gate conductor 162 and n+ doped region 180' can also be formed by omitting sidewall insulator 176 from the structure illustrated in FIG. 3e. The process steps illustrated in FIGS. 6a–6c can then be omitted. The structure illustrated in FIG. 6d is then formed except the remaining portion of sidewall insulator 176 is absent.

In addition to providing a subsurface FET, a stack of FETs, a vertical conductor, and circuits such as a CMOS invertor, the present invention provides a horizontal connector formed in association with a subsurface device structure such as an electrode of a transistor or diode. Electrodes include the gate, source, and drain of an FET, the emitter, base, and collector of a bipolar transistor, and either terminal of a rectifying contact. Rectifying contacts include pn diodes and Schottky barrier diodes. The connector provides means to significantly increase device speed by (1) providing a subsurface connector significantly lower in resistance than achievable by previously available means, and (2) sharply reducing junction capacitance (such as source or drain-substrate capacitance or collector-substrate capacitance) by providing a silicon-on insulator structure. The horizontal connector is illustrated hereinbelow by reference to a bipolar transistor collector and collector contact, but the same process is used to provide doped regions, contacts, or improved isolation for the other device structures mentioned hereinabove.

Figure 7:
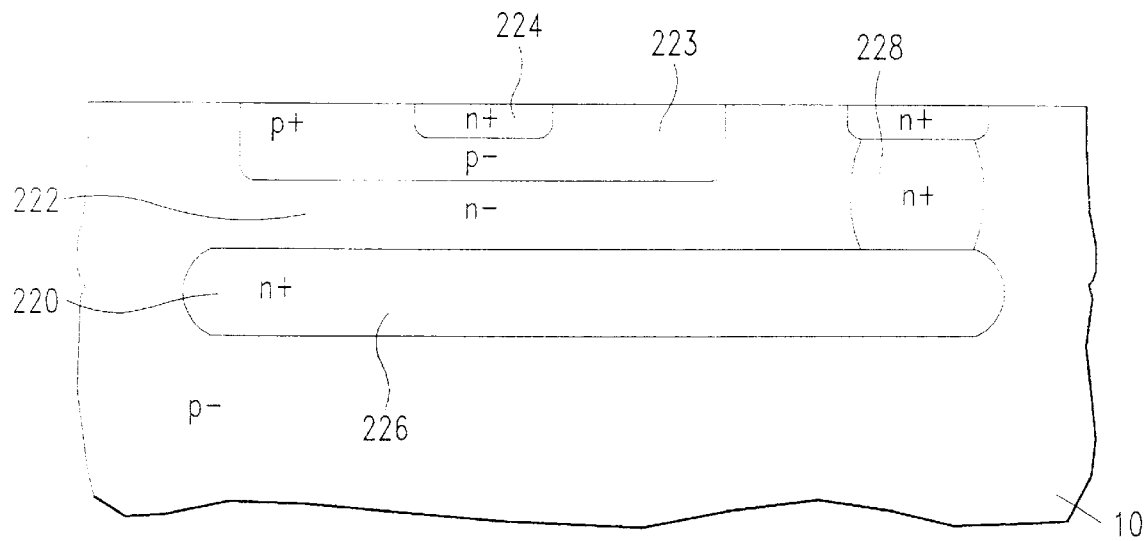
FIG. 7 is a cross-sectional view showing a bipolar transistor of the prior art.

FIG. 7 illustrates elements of a prior art bipolar transistor showing heavily doped subcollector 220 formed below more lightly doped collector region 222 below base 223 and emitter 224. Subcollector 220 is usually formed by epitaxial growth from a heavily doped region of semiconductor substrate 10.

Described below is low resistance subcollector formed of low resistivity materials embedded in the silicon substrate providing significantly lower resistance than the heavily doped subcollector 220 of the prior art. And, as will be seen hereinbelow, the subcollector of the present invention is mounted on an insulating layer, providing a silicon on insulator (SOI) structure significantly lower in capacitance than semiconductor junction 226 of the prior art. The result is a significant increase in device speed without an increase in power consumption.

Figure 8:
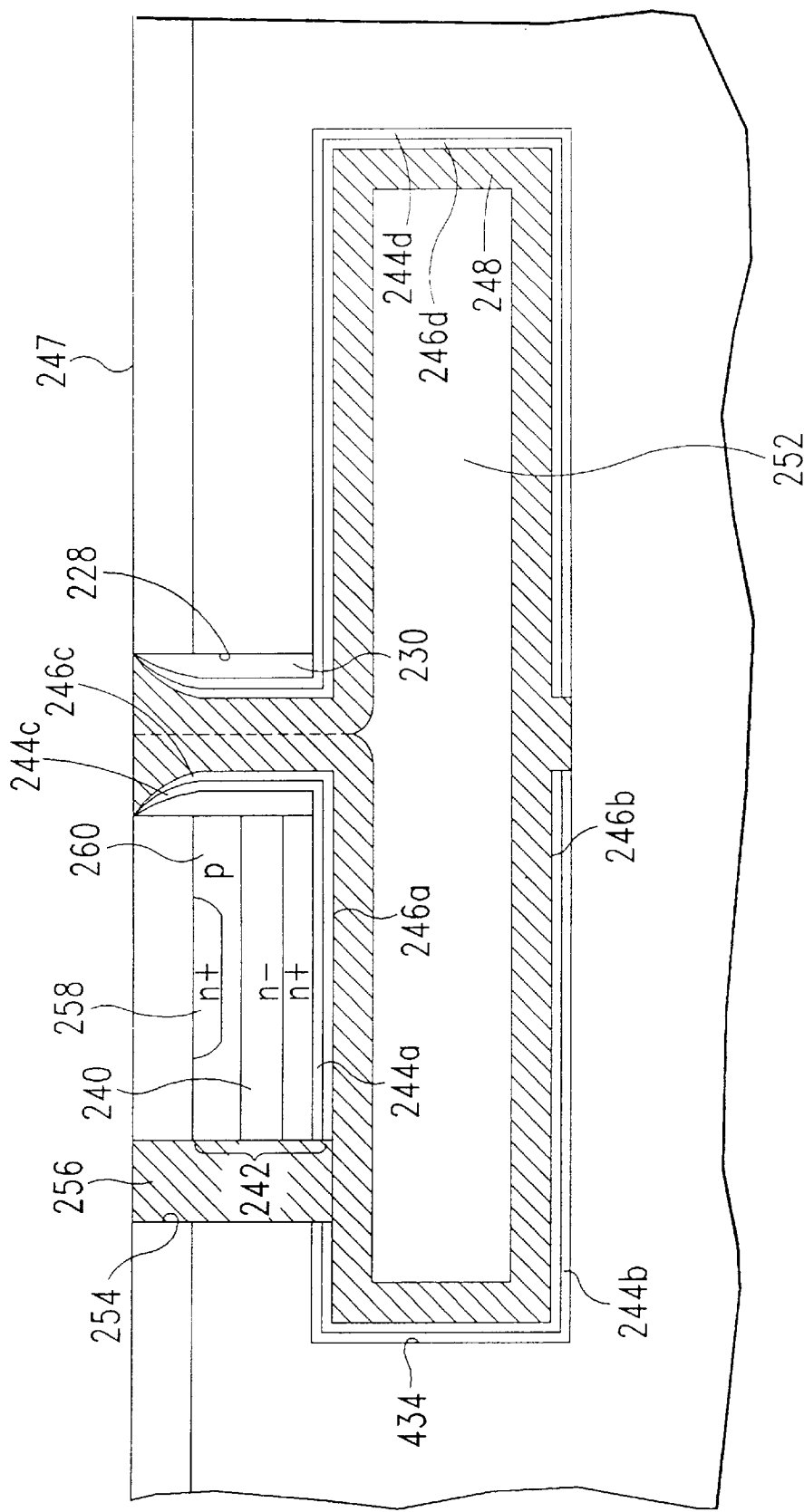
FIG. 8 is a cross-sectional view of the horizontal connector of the present invention which may form the subcollector of a bipolar transistor.

As illustrated in FIG. 8, vertical trench 228 with insulating etch stop layer 230 and horizontal trench 434 are formed as described hereinabove, with horizontal trench 434 located below base 260 of bipolar transistor 242. Insulating layer 230 is formed from materials such as silicon dioxide and silicon nitride. Then, first and second layers of conductive material 244 and 246 are deposited. First conductive material 244 can be formed from heavily doped polysilicon which provides a doping source for a desired collector doping profile after all heat cycles are complete. The dopant is an element such as arsenic, phosphorous, boron, or antimony. Conductive material 244 can also be formed from TiN, a metal, a metal silicide, or a silicide forming metal.

Conductive material 244 can be omitted if the collector is otherwise doped (or if instead of a bipolar transistor, it is desired to form a subsurface Schottky diode, for which no additional doping is needed). Second conductive material 246 is deposited to form a layer with high conductivity. Conductive material 246 is formed from a metal, a metal silicide, or a silicide forming metal, TiN, or heavily doped silicon. Refractory metals such as tungsten, titanium, and molybdenum are suitable. If deposited after hot process steps are complete, metals such as aluminum are suitable. Conductive materials 244 and 246 are then removed from exposed horizontal surfaces, such as chip surface 247, and the bottom of vertical trench 228, by a directional etch. Along with isolation trench 254 described below, the removal of conductive materials 244 and 246 from the bottom of vertical trench 228 separates left and right devices and disconnects conductive materials 244a and 246b from direct contact with substrate 220.

Conductive material 246 extends along horizontal trench 434 and along insulating layer 230 of vertical trench 228 to surface 247 where contact to other structures can be formed. Thus, the structure automatically provides a high conductivity "reach-through" connecting sub-surface subcollector portion 244a and 246a with surface portions 244c and 246c. Prior art bipolar transistors required a separate masking and doping step to provide this reach-through contact to the surface (illustrated in FIG. 7 by number 228).

While a low resistance subcollector would be achieved by filling horizontal trench 434 with conductive material 246, a structure that also provides reduced capacitance is achieved by depositing an insulator or leaving space within horizontal trench 434 to form an SOI structure. After trench 434 is partially filled with conductive materials 244 and 246, insulating film 248 is deposited as illustrated in FIG. 8. Insulating film 248 is formed from materials such as silicon dioxide, silicon nitride, aluminum oxide, and polymers such as polyimide. While dimensions can be adjusted so insulating film 248 completely fills remaining space within conductive material 246 in horizontal trench 434, farther reduced capacitance is achieved by providing that the height of horizontal trench 248 is more than the width of vertical trench 228. Thus, vertical trench 228 is sealed with insulating film 248, leaving void 252 within horizontal trench 434, also as illustrated in FIG. 8. Void 252 has a dielectric constant about one fourth that of a solid insulator and thus provides a smaller capacitance. Void 252 may have a gas ambient similar to that of the insulator deposition chamber.

Standard oxide sidewall isolation is provided by forming vertical isolation trench 254 and filling trench 254 with dielectric 256 by thermal growth and deposition means known in the art, also as illustrated in FIG. 8. Isolation trench 254 can extend around the periphery of the device and can intersect vertical trench 228 so as to isolate conductive materials 244*a* and 246*a* from 244*b*, 244*d*, 246*b*, and 246*d*.

Contacts to emitter 258 and base 260 are by standard methods known in the art or may be by means of vertical and horizontal trenches as described hereinabove for the subcollector.

The process described hereinabove for forming a subsurface subcollector, and contacts thereto, is also used for forming any subsurface doped region or subsurface contacts to any doped region, including diode electrodes, base, emitter, source, and drain. In each case the horizontal trench contact described hereinabove provides the advantages of a low resistance and low capacitance path. The replacement of junction with low silicon-on-insulator capacitance significantly reduces device capacitance. The reduced resistance and capacitance significantly increases the performance of bipolar transistors and FETs.

Figure 9:
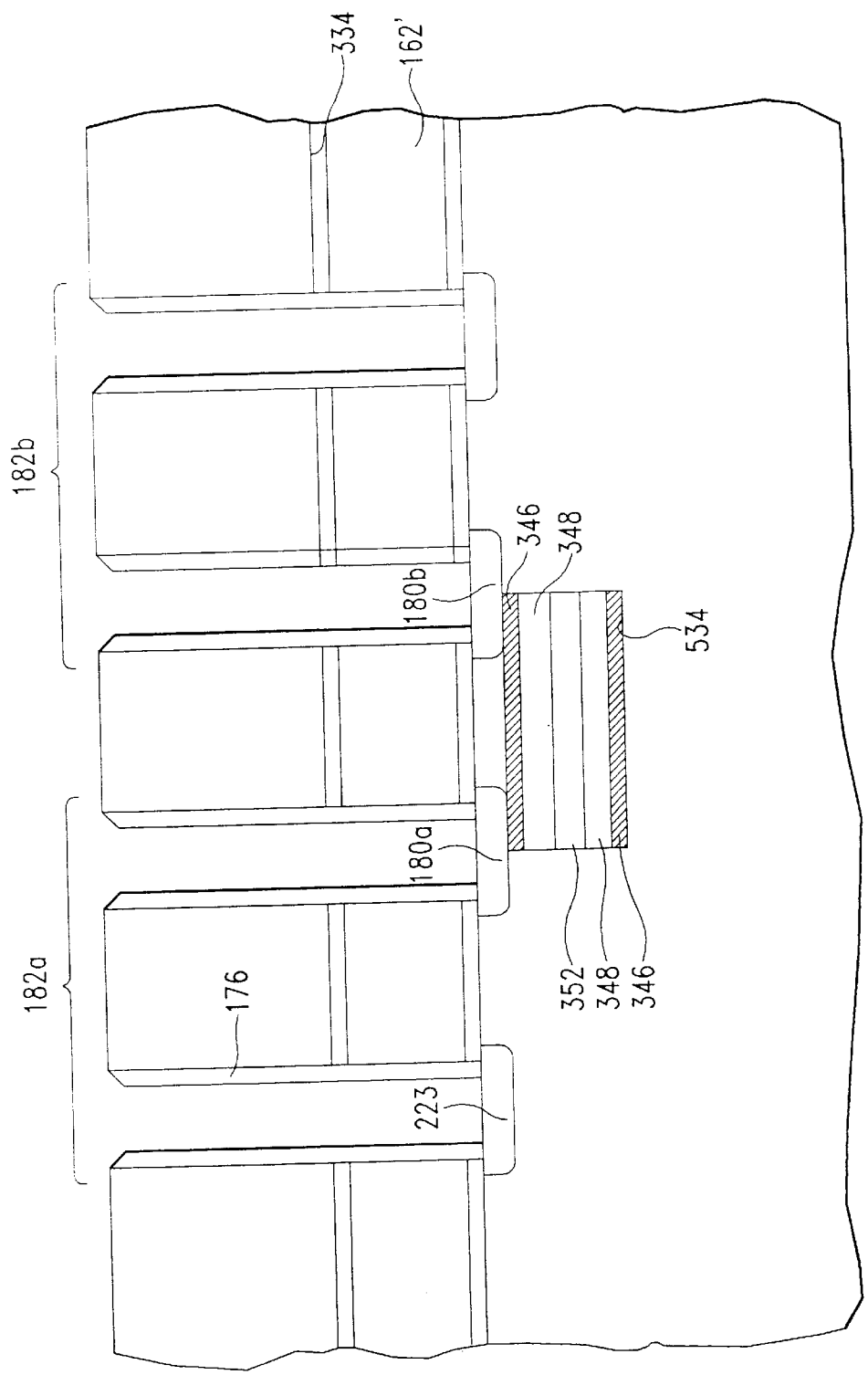
FIG. 9 is a cross-sectional view of a subsurface horizontal connector linking diffused regions of two transistors.

In addition, horizontal connection between electrodes of two transistors can be formed using the horizontal connector of the present invention. As illustrated in FIG. 9, the drain 180*a* of first transistor 182*a* is connected to source 180*b* of second transistor 182*b* by means of horizontal conductor 346 in horizontal trench 534. Horizontal conductor 346 forms ohmic contacts to both doped regions 180*a* and 180*b*. Horizontal conductor 346 is formed from conductive materials as described hereinabove. Trench 534 with conductor 346 and insulators 348 and 352 are formed by the process described hereinabove (FIG. 8).

Figure 10:
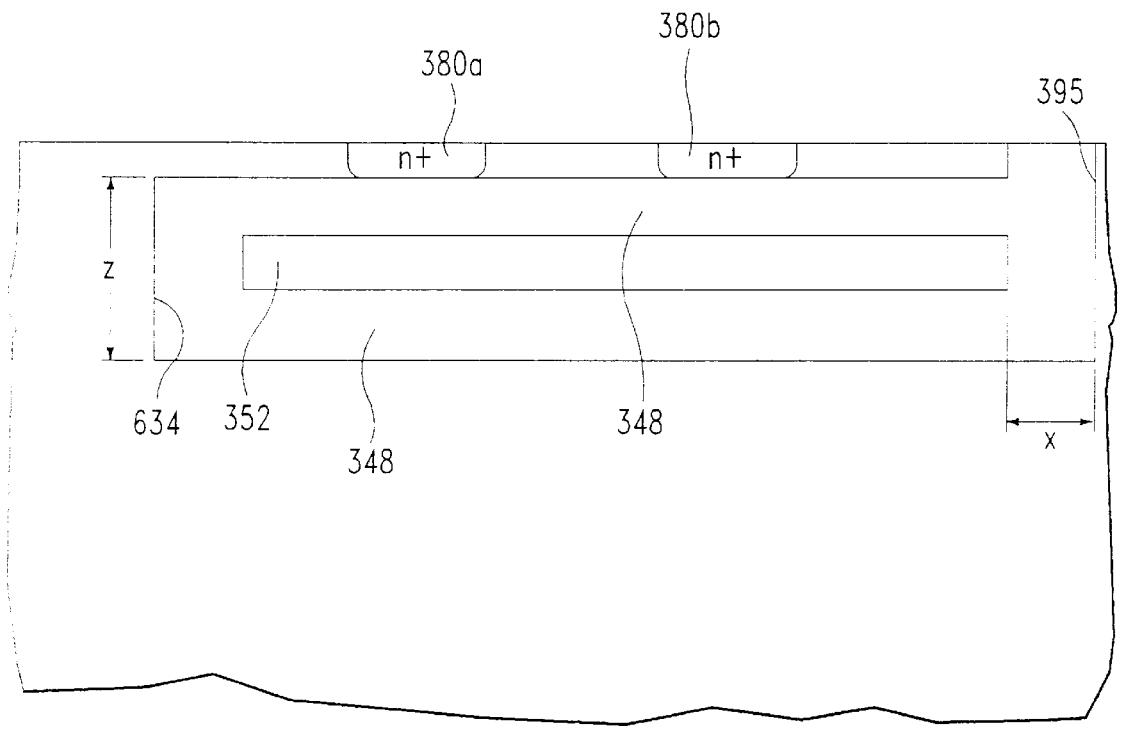
FIG. 10 is a cross-sectional view of a subsurface horizontal isolation under diffused regions and a channel region of a transistor.

Illustrated in FIG. 10 is an improved subsurface isolation for diffusions or for the channel region of an FET. Horizontal trench 634 is formed and either filled or partially filled with insulator 348. Insulator 348 is formed of materials such as silicon oxide, silicon nitride, aluminum oxide, and polyimide. As discussed above, void 352 may be left in the insulator providing decreased dielectric constant. An FET formed in the channel between diffusions 380*a* and 380*b* can have significantly improved performance due to the silicon-on-insulator isolation. As shown, vertical trench 395 is completely filled with insulator 348, while horizontal trench 634 is only partially filled since the width x of the vertical trench is less than the height z of the horizontal trench.

Since the same technology is used to form subsurface FETs and subsurface bipolar structures the present invention is well suited for the formation of both FETs and bipolar transistors on a single substrate. Since each has significant advantages for speed and packing density, the ability to form both types provides significant advantage both to the circuit designer and for chip performance.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method of forming a horizontal trench in a substrate, the method comprising the steps of:

providing a bulk single crystal substrate having a p+ diffused layer;

etching a vertical trench in said substrate intersecting said p+ layer;

forming porous silicon in said p+ layer; and etching away said porous silicon.

2. A method as recited in claim 1 wherein said vertical trench etching step is performed before said p+ doped layer is provided.

3. A method as recited in claim 1, wherein said porous silicon etch is accomplished by first oxidizing said porous silicon to form a silicon oxide and then etching said oxide.

* * * * *